United States Patent
Iizumi et al.

(10) Patent No.: US 8,124,967 B2
(45) Date of Patent: Feb. 28, 2012

(54) ORGANIC ELECTROLUMINESCENCE ELEMENT AND PRODUCTION METHOD THEREOF

(75) Inventors: Yasuhiro Iizumi, Tokyo-to (JP); Norihito Itoh, Tokyo-to (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 212 days.

(21) Appl. No.: 12/517,598

(22) PCT Filed: Dec. 19, 2007

(86) PCT No.: PCT/JP2007/074464
§ 371 (c)(1), (2), (4) Date: Jun. 4, 2009

(87) PCT Pub. No.: WO2008/075731
PCT Pub. Date: Jun. 26, 2008

(65) Prior Publication Data
US 2010/0019235 A1  Jan. 28, 2010

(30) Foreign Application Priority Data
Dec. 20, 2006 (JP) .................. 2006-342620

(51) Int. Cl.
*H01L 51/50* (2006.01)
*B05D 3/06* (2006.01)

(52) U.S. Cl. .......... 257/40; 257/98; 257/E51.026; 257/E39.007; 438/29; 438/99; 438/795; 427/553

(58) Field of Classification Search .......... 257/40, 257/98, E51.026, E39.007; 438/29, 99, 795; 427/553

See application file for complete search history.

(56) References Cited

U.S. PATENT DOCUMENTS
2006/0246293 A1* 11/2006 Iizumi et al. .......... 428/411.1

FOREIGN PATENT DOCUMENTS
| JP | 2001-257073 A | 9/2001 |
| JP | 2002-231446 A | 8/2002 |
| JP | 2004-071286 A | 3/2004 |
| JP | 2004-071473 A | 3/2004 |
| JP | 2004-171882 A | 6/2004 |
| JP | 3601716 B2 | 10/2004 |
| JP | 3646510 B2 | 2/2005 |
| JP | 2005-300926 A | 10/2005 |
| JP | 2006-310036 A | 11/2006 |
| JP | 2006-313652 A | 11/2006 |

OTHER PUBLICATIONS
International Search Report: PCT/JP2007/074464.
* cited by examiner

*Primary Examiner* — Tom Thomas
*Assistant Examiner* — Benjamin Tzu-Hung Liu
(74) *Attorney, Agent, or Firm* — Ladas & Parry LLP

(57) ABSTRACT

A method of producing an organic EL element that allows easier patterning of the organic EL layer and reduction of the damage of the electrode layer caused by the organic EL layer and is superior in emission characteristics. Also provided is an organic electroluminescence element, including a substrate, a first electrode layer, a wettability variable layer, an organic EL layer, and a second electrode layer sequentially laminated. The wettability variable layer changes its wettability under the action of a photocatalyst caused by energy irradiation, is inactive to the energy, and has on the surface, a wettability variable pattern having an organopolysiloxane-containing lyophilic region and a liquid repellent region containing a fluorine-containing organopolysiloxane.

16 Claims, 5 Drawing Sheets

ORGANIC ELECTROLUMINESCENCE ELEMENT AND PRODUCTION METHOD THEREOF

TECHNICAL FIELD

The present invention relates to a method of producing an organic electroluminescence element wherein an organic electroluminescence (hereinafter, referred to as EL layer) layer is patterned by using a wettability variable layer that changes its wettability under the action of a photocatalyst caused by energy irradiation and an organic EL element produced by the method.

BACKGROUND ART

The EL elements are elements, in which holes and electrons injected from two electrodes facing each other bind in a light-emitting layer to each other and a fluorescent material presented in the light-emitting layer is excited by the energy, emitting a light in the color inherent to the fluorescent material, and are attracting attention as a self-luminous flat display element. In particular, organic EL displays employing an organic material as the light-emitting material are higher in emission efficiency, for example allowing high-brightness emission even at an applied voltage of less than 10 V, and allow light emission in a simple element structure. Thus, their application to low-priced simplified display used for advertisement and others, which displays a particular pattern by emission, is highly expected.

Generally, in production of a display employing an EL element, an organic EL layer comprising layers such as a light-emitting layer, a hole-injecting layer, a hole-transporting layer, an electron-injecting layer, and an electron-transporting layer is patterned. Various patterning methods such as a vapor deposition of the light-emitting material through a shadow mask, a printing by inkjet, a decomposition of a particular light-emitting colorant by UV irradiation, a screen printing has been proposed as the methods of patterning the light-emitting layer. In the case of the inkjet printing method, formation of a patterned barrier (bank) and ink-repellent treatment of the barrier were proposed for obtaining a high-definition ultrafine pattern (e.g., see Patent Documents 1 and 2). In addition, a method using a photocatalyst enabling high-definition patterning has also been proposed as the methods of patterning the light-emitting layer (see e.g., Patent Documents 3 and 4).

The method using a photocatalyst and patterning the organic EL layer utilizes the change in wettability of the photocatalyst-containing layer caused by the energy irradiated to the photocatalyst-containing layer and the subsequent action of the excited photocatalyst. In other words, an organic EL layer is patterned, while the difference in wettability is utilized in patterning. Thus, since the method of using a photocatalyst and patterning the organic EL layer allows patterning by using the difference in wettability generated only by energy irradiation, it is a method useful for drastic reduction in the labor demanded for patterning the organic EL layer.

However in such a method of using a photocatalyst and patterning the organic EL layer, the photocatalyst such as titanium oxide is normally granular and thus, the surface of the photocatalyst-containing layer is often roughened. This unfavorably leads to increase in the barrier at the interface between the organic EL layer such as light-emitting layer and the photocatalyst-containing layer, hinders transport of electric charges, and deterioration in emission characteristics.

The surface roughening of the photocatalyst-containing layer also causes problems such as unevenness in thickness of a relatively thin light-emitting layer and short circuiting between electrodes.

Proposed to overcome the problems above were methods of patterning the EL layer by using the difference in wettability, specifically by using a substrate having a photocatalyst-containing layer, providing a layer that changes its wettability under the action of a photocatalyst caused by energy irradiation and a photocatalyst-containing layer at positions facing each other, and irradiating the layers with energy to change the wettability of the layer surface (see e.g. Patent Documents 5 and 6).

Patent Document 5 discloses a method of patterning an organic EL layer by using a charge injecting/transporting layer that changes its wettability under the action of a photocatalyst caused by energy irradiation. The charge injecting/transporting layer contains: a binder such as organopolysiloxane and a photocatalyst, or materials commonly used in charge injecting/transporting layer such as polyethylenedioxythiophene/polystyrenesulfonic acid (PEDOT/PSS). In the former case, the surface roughening of the charge injecting/transporting layer is desired to be reduced further, because it contains a photocatalyst. In the latter case, the charge injecting/transporting layer may not show favorable change in wettability, because it contains the materials commonly used in the charge injecting/transporting layer.

Patent Document 6 discloses a method of patterning an organic EL layer, by using a wettability variable layer that changes its wettability under the action of a photocatalyst caused by energy irradiation. The wettability variable layer preferably contains a conductive material in order to enable transportation, for example, of holes. However, although Patent Document 6 describes the method of producing the pattern forming body in detail, it does not describe the configuration of the organic EL element and the preparative method thereof in detail.

Alternatively, Patent Document 5 discloses a method of patterning an organic EL layer by using a decomposing-removing layer that is decomposed and removed under the action of a photocatalyst caused by energy irradiation. It is a method of patterning an organic EL layer by using the difference in wettability between: the region of the decomposing-removing layer where the undercoat layer thereof is exposed by decomposition and removal of the decomposing-removing layer under the action of a photocatalyst caused by energy irradiation, and the region retaining the decomposing-removing layer because no energy is irradiated thereto. In this case, the organic EL layer is formed on the region where the undercoat layer below the decomposing-removing layer, for example electrode layer, is exposed.

Patent Document 1: Japanese Patent No. 3601716
Patent Document 2: Japanese Patent No. 3646510
Patent Document 3: Japanese Patent Application Laid-Open (JP-A) No. 2001-257073
Patent Document 4: JP-A No. 2002-231446
Patent Document 5: JP-A No. 2004-71286
Patent Document 6: JP-A No. 2005-300926

DISCLOSURE OF THE INVENTION

Problems to be solved by the Invention

There are materials doped with an acid such as polyethylenedioxythiophene/polystyrenesulfonic acid (PEDOT/PSS) that are acidic or neutral. In the method of patterning an organic EL layer by using the decomposing-removing layer that can be removed by decomposition under the action of a photocatalyst caused by energy irradiation, if a hole-injecting layer is formed in the exposed region where, for example, an electrode layer such as ITO film is exposed and if an acidic compound PEDOT/PSS is used as the hole-injecting layer, the electrode layer may be unfavorably damaged, for example, by solubilization by the acidity of PEDOT/PSS. Materials doped with an acid such as PEDOT/PSS are often used as the hole-injecting layers, and thus, if an acidic material doped with an acid is used, it is desirable to reduce the damage of the electrode layer under the influence of the acid contained in the hole-injecting layer.

An object of the present invention, which was made to overcome the problems above, is to provide a method of producing an organic EL element that allows easier patterning of the organic EL layer and reduction of the damage of the electrode layer caused by the organic EL layer and is superior in emission characteristics.

Means for Solving the Problems

To attain the above object, the present invention, provides an organic EL element, comprising: a substrate; a first electrode layer formed in pattern on the substrate; a wettability variable layer formed on the first electrode layer, wherein the layer changes its wettability under an action of a photocatalyst caused by energy irradiation, is inactive to the energy, and has, on a surface thereof, a wettability variable pattern comprising a lyophilic region formed on the pattern of the first electrode layer and containing organopolysiloxane and a liquid repellent region formed on an opening of the pattern of the first electrode layer and containing a fluorine-containing organopolysiloxane; an organic EL layer formed on the lyophilic region of the wettability variable layer and contains at least a light-emitting layer; and a second electrode layer formed on the organic EL layer.

Fluorine is an element having extremely low surface energy. In the present invention, because the lyophilic region on the surface of the wettability variable layer contains an organopolysiloxane and the liquid repellent region contains a fluorine-containing organopolysiloxane, if the lyophilic and liquid repellent regions are compared, the lyophilic region has a larger critical surface tension. According to the present invention, it is possible, by using the difference in wettability between the liquid repellency and lyophilic regions, to form an organic EL layer only on the lyophilic region and produce an organic EL element allowing easy patterning of the organic EL layer.

The wettability variable layer according to the present invention changes its wettability under the action of a photocatalyst caused by energy irradiation, but is inactive to the energy, and thus, does not contain a photocatalyst practically. For that reason, the wettability variable layer is favorably smooth, and it is thus possible to reduce the barrier at the interface between the wettability variable layer and the organic EL layer and to improve the emission characteristics.

Further according to the present invention, since a wettability variable layer is formed between the first electrode layer and the organic EL layer, direct contact of the organic EL layer to the first electrode layer is prevented. Accordingly, for example if a hole injecting/transporting layer of an acidic material is formed on the wettability variable layer, the first electrode layer is protected by the wettability variable layer. Thus, it is possible to reduce the damage of the first electrode layer under the influence of the acid contained in the hole injecting/transporting layer.

In the invention above, the organic EL layer preferably comprises a hole injecting/transporting layer, and the hole injecting/transporting layer is preferably formed between the wettability variable layer and the light-emitting layer. As described above, if an acidic material is used as the hole injecting/transporting layer, it is possible to reduce the damage of the first electrode layer under the influence of the acid contained in the hole injecting/transporting layer. For that reason, the organic EL element of the present invention is particularly useful when it has the configuration above.

In the present invention, the thickness of the wettability variable layer is preferably 20 nm or less. It is because, when the thickness of the wettability variable layer is in the range above, electric charges are tunnel-injected by the external electric field.

Additionally in the present invention, an insulation layer may be formed on the opening of the pattern of the first electrode layer formed on the substrate. It is because, in this case, the wettability variable layer is formed on the first electrode layer and the insulation layer, the lyophilic region is provided on the first electrode layer, and the liquid repellent region is provided on the insulation layer, and it is thus possible to use the insulation layer as a barrier and pattern the organic EL layer accurately.

The present invention also provides a method of producing an organic EL element, comprising: a wettability variable layer-forming step of forming a wettability variable layer, which changes its wettability under an action of a photocatalyst caused by energy irradiation, on a substrate having an electrode layer formed; a wettability variable pattern-forming step of forming a wettability variable pattern of a lyophilic region and a liquid repellent region on the wettability variable layer surface, wherein the pattern is formed by providing a photocatalyst treatment layer substrate, which has a photocatalyst treatment layer containing at least a photocatalyst formed on a base body, at a distance allowing the action of the photocatalyst caused by energy irradiation to reach the wettability variable layer and by irradiating the photocatalyst treatment layer substrate with energy in pattern; and an organic EL layer-forming step of forming an organic EL layer containing at least a light-emitting layer on the lyophilic region.

According to the present invention, it is possible to pattern the organic EL layer easily by forming a wettability variable pattern by means of irradiating the wettability variable layer with energy via the photocatalyst treatment layer and using the difference in wettability of the wettability variable pattern. Because the photocatalyst is contained in the photocatalyst treatment layer and the photocatalyst treatment layer substrate having the photocatalyst treatment layer is separated from the wettability variable layer after the wettability variable pattern-forming step and the wettability variable layer does not contain the photocatalyst, it is possible to reduce the barrier at the interface between the wettability variable layer and the organic EL layer and to improve the emission characteristics.

Additionally according to the present invention, because the wettability variable layer is formed on the electrode layer and the organic EL layer is formed on the wettability variable layer, the organic EL layer is not formed directly on the electrode layer. For that reason, even if a hole injecting/transporting layer is formed by using an acidic material on the wettability variable layer, the electrode layer is protected by the wettability variable layer and the damage of the electrode layer under the influence of the acid contained in the hole injecting/transporting layer can be reduced.

In the invention above, the photocatalyst treatment layer may be formed in pattern on the base body of the photocatalyst treatment layer substrate. In this case, only the wettability variable layer surface facing the photocatalyst treatment layer shows change in wettability during energy irradiation, and thus, the entire surface can be irradiated with energy without need for using a photomask or laser beam. Thus, the present invention is advantageous in forming the wettability variable pattern.

Alternatively, a light shielding part may be formed in pattern on the base body of the photocatalyst treatment layer substrate. In this case, there is no need during energy irradiation for use of a photomask or imaging irradiation with laser beam. Thus similarly to the case above, the invention is advantageous information of the wettability variable pattern.

Further in the present invention, the organic EL layer-forming step preferably includes a hole injecting/transporting layer step of forming a hole injecting/transporting layer on the lyophilic region, and a light-emitting layer-forming step of forming the light-emitting layer on the hole injecting/transporting layer. It is because, as described above, if the hole injecting/transporting layer is formed by using an acidic material, the damage of the electrode layer under the influence of the acid contained in the hole injecting/transporting layer can be reduced.

In the present invention, the wettability variable layer preferably contains an organopolysiloxane of a hydrolysate or a cohydrolysate of one or more silicon compounds represented by the formula:

$Y_n SiX_{(4-n)}$ (in which, "Y" represents an alkyl group, a fluoroalkyl group, a vinyl group, an amino group, a phenyl group or an epoxy group; "X" represents an alkoxyl group or an acetyl group or a halogen; and "n" is an integer of 0 to 3). The material for use as the wettability variable layer should be a material that changes its wettability under the action of the photocatalyst and has a bond energy strong enough to be resistant to decomposition under the action of the photocatalyst, and thus, the organopolysiloxanes described above are preferable.

Further in the present invention, an insulation layer-forming step of forming an insulation layer, reflecting or absorbing the energy irradiated in the wettability variable pattern-forming step, on the opening of the pattern of the electrode layer formed on the substrate having the electrode layer formed in pattern thereon may be carried out, in advance to the wettability variable layer-forming step. It is because, if such an insulation layer is formed, it is possible to irradiate the entire surface from the substrate side with energy in the wettability variable pattern-forming step, without need for using a photomask or laser beam.

Effects of the Invention

Advantageously in the present invention, because a wettability variable layer is formed between the first electrode layer and the organic EL layer, for example if a hole injecting/transporting layer is formed by using an acidic material on the first electrode layer, it is possible to reduce the damage of the first electrode layer under the influence of the acid contained in the hole injecting/transporting layer. Because the wettability variable layer contains practically no photocatalyst, it is also, advantageously possible to improve the smoothness of the wettability variable layer and obtain favorable emission characteristics.

EXPLANATION OF REFERENCES

Figure 1:
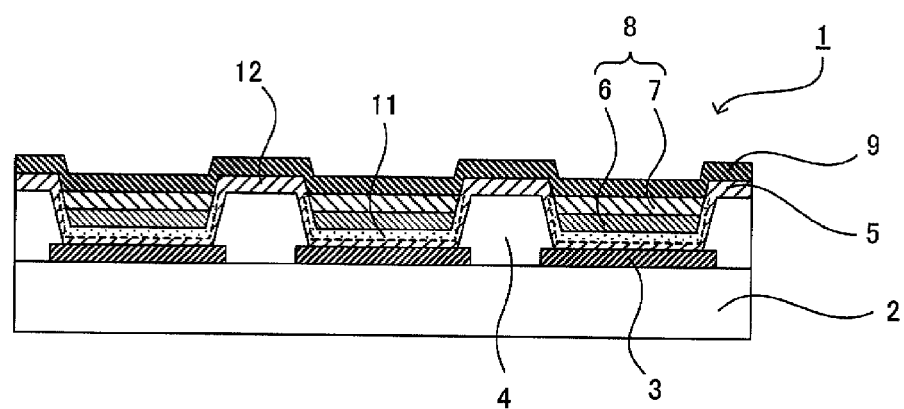
FIG. 1 is a schematic sectional view illustrating an example of the organic EL element according to the present invention.

1: Organic EL element
2: Substrate
3: First electrode layer (electrode layer)
4: Insulation layer
5: Wettability variable layer
6: Hole-injecting layer
7: Light-emitting layer
8: Organic EL layer
9: Second electrode layer (counter electrode layer)
11: Lyophilic region
12: Liquid repellent region
21: Photocatalyst treatment layer substrate
22: Base body
23: Light shielding part
24: Photocatalyst treatment layer

BEST MODE FOR CARRYING OUT THE INVENTION

Hereinafter, the organic EL element and its production method of the present invention will be described in detail.

A. Organic EL Element

The organic EL element according to the present invention comprises: a substrate; a first electrode layer formed in pattern on the substrate; a wettability variable layer formed on the first electrode layer, wherein the layer changes its wettability under an action of a photocatalyst caused by energy irradiation, is inactive to the energy, and has, on a surface thereof, a wettability variable pattern comprising a lyophilic region formed on the pattern of the first electrode layer and containing organopolysiloxane and a liquid repellent region formed on an opening of the pattern of the first electrode layer and containing a fluorine-containing organopolysiloxane; an organic EL layer formed on the lyophilic region of the wettability variable layer and contains at least a light-emitting layer; and a second electrode layer formed on the organic EL layer.

Hereinafter, the organic EL element according to the present invention will be described with reference to drawings.

FIG. 1 is a schematic sectional view illustrating an example of the organic EL element according to the present invention. In the organic EL element 1 exemplified in FIG. 1, a first electrode layer 3 is formed in pattern on a substrate 2; an insulation layer 4 is formed on the opening of the pattern of the first electrode layer 3; a wettability variable layer 5 is formed on the first electrode layer 3 and the insulation layer 4; a wettability variable pattern comprising a lyophilic region 11 and a liquid repellent region 12 is formed on the surface of the wettability variable layer 5; an organic EL layer 8 having a hole-injecting layer 6 and a light-emitting layer 7 laminated in that order is formed on the lyophilic region 11; and a second electrode layer 9 is formed on the light-emitting layer 7. The lyophilic region 11 on the surface of the wettability variable layer 5 that contains an organopolysiloxane is formed on the pattern of the first electrode layer 3. Further, the liquid repellent region 12 on the surface of the wettability variable layer 5 that contains a fluorine-containing organopolysiloxane is formed on the opening of the pattern of the first electrode layer 3, i.e., on the insulation layer 4.

Fluorine is an element having extremely low surface energy. Thus, substances containing many fluorine atoms have a surface lower in critical surface tension. In other words, the critical surface tension of the region lower in fluorine content is higher than that of the region higher in fluorine content.

In the present invention, the lyophilic region on the surface of the wettability variable layer contains an organopolysiloxane, while the liquid repellent region on the surface of the wettability variable layer contains a fluorine-containing organopolysiloxane, and thus, the fluorine content of the liquid repellent region is higher than that of the lyophilic region. Thus, the critical surface tension of the lyophilic region is higher than that of the liquid repellent region.

In this way, the liquid repellent region and the lyophilic region are different from each other in their critical surface tensions, i.e., in wettability, and it is possible to form an organic EL layer only in the lyophilic region, by using the difference in wettability between the liquid repellent and lyophilic regions. It is thus possible to produce an organic EL element having an organic EL layer allowing easy patterning without need for a complicated patterning step or installation of an expensive vacuum facility.

The wettability variable layer according to the present invention changes its wettability under the action of a photocatalyst caused by energy irradiation. For example, if a wettability variable layer and a photocatalyst-containing layer are placed facing each other, as separated by a particular distance, and energy such as ultraviolet ray is irradiated to the photocatalyst-containing layer. When the ultraviolet ray irradiates the photocatalyst, it generates active oxygen species such as superoxide radical ($.O_2^-$) and hydroxy radical (.OH). The active oxygen species, with their strong oxidation-reduction potentials, decompose the organic substance contained in the wettability variable layer. In this way, the wettability variable layer changes its wettability.

Figure 2A:
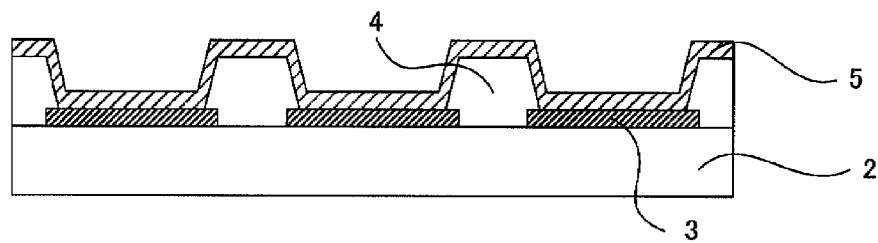
FIGS. 2A to 2E are a process chart showing an example of the method of producing the organic EL element according to the present invention.
Figure 2B:
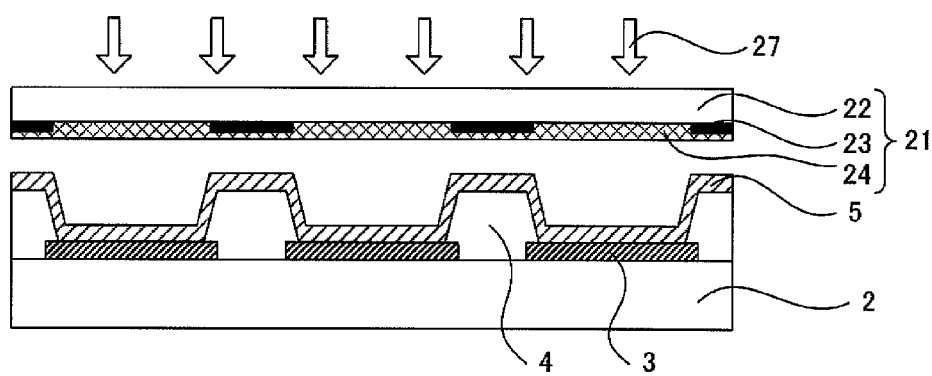
Figure 2C:
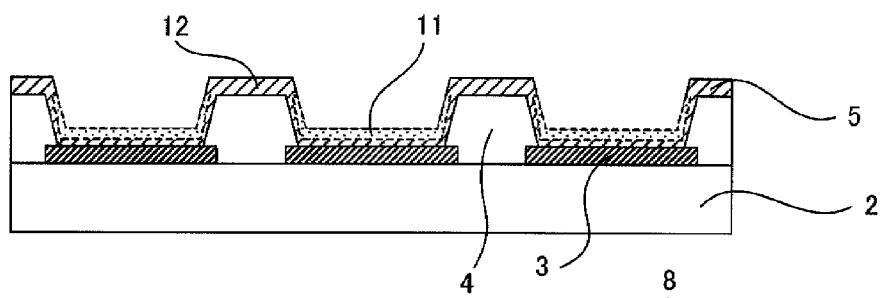
Figure 2D:
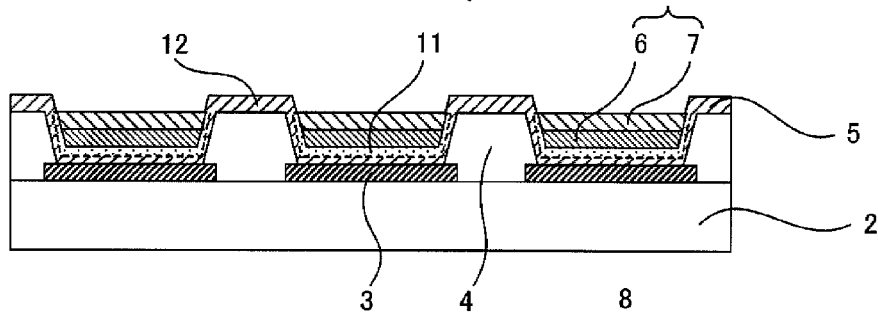
Figure 2E:
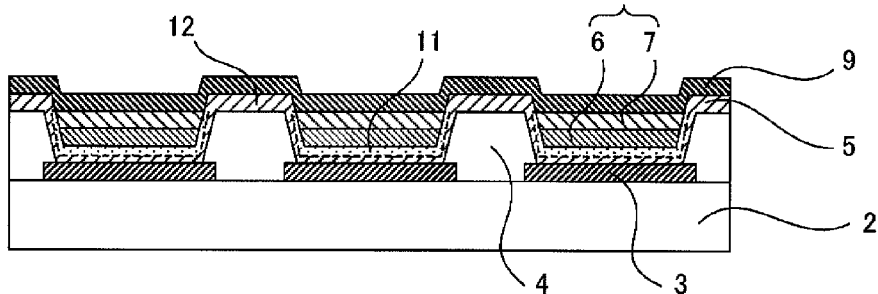

FIGS. 2A to 2E are a process chart illustrating an example of the production method for the organic EL element according to the present invention. As shown in FIG. 2A, a first electrode layer 3 is formed in pattern on a substrate 2; an insulation layer 4 is formed on the opening of the pattern of the first electrode layer 3, and a wettability variable layer 5 is formed on the first electrode layer 3 and the insulation layer 4. Separately as shown in FIG. 2B, a photocatalyst treatment layer substrate 21 comprising a base body 22, light shielding parts 23 formed in pattern on the base body 22, and a photocatalyst-containing photocatalyst treatment layer 24 formed on the base body 22 as to cover the light shielding parts 23. Then, the photocatalyst treatment layer substrate 21 is provided on the wettability variable layer 5 so as its photocatalyst treatment layer 24 face the layer 5, and is irradiated with ultraviolet ray 27. As shown in FIG. 2C, irradiation of the ultraviolet ray 27 decomposes the fluorine-containing branched chains in the fluorine-containing organopolysiloxane in the UV irradiation region on the wettability variable layer 5 under the action of the photocatalyst contained in the photocatalyst treatment layer 24, leading to decrease in fluorine content by decomposition and change in wettability toward decrease in the contact angle with liquid. The region reduced in fluorine content becomes a lyophilic region 11. On the other hand, in the region where no ultraviolet ray is irradiated, the fluorine-containing organopolysiloxane remains intact as it is without change in fluorine content or wettability. The region where no fluorine content changes becomes a liquid repellent region 12. The photocatalyst treatment layer substrate 21 is then removed from the wettability variable layer 5. Then as shown in FIG. 2D, a hole-injecting layer 6 and a light-emitting layer 7 are formed only on the lyophilic region 11 by using the difference in wettability between the lyophilic region 11 and the liquid repellent region 12, to form an organic EL layer 8. Then as shown in FIG. 2E, the second electrode layer 9 is formed on the organic EL layer 8.

Even if the wettability variable layer itself does not contain a photocatalyst, it is possible to change the wettability of the surface of the wettability variable layer under the action of the photocatalyst by irradiating the wettability variable layer with energy via the photocatalyst-containing photocatalyst treatment layer.

In addition, the wettability variable layer according to the present invention is inert to energy. The energy, as used herein, is the energy of the light, specifically ultraviolet ray or the like, irradiated for activation of the photocatalyst. The phrase that the wettability variable layer is inert to energy means that there is no reaction of the constituent materials for the wettability variable layer at all during irradiation of the ultraviolet ray or the like to the wettability variable layer.

As described above, the wettability variable layer according to the present invention can only react under the action of the photocatalyst, and there is no reaction in the absence of the photocatalyst, even if energy is irradiated. Thus, the phrase that the wettability variable layer is inert to energy means specifically that the wettability variable layer contains practically no photocatalyst.

The phrase that the wettability variable layer contains practically no photocatalyst means that the content of the photocatalyst in the wettability variable layer is 1 wt % or less.

Thus, the wettability variable layer according to the present invention, which contains practically no photocatalyst, is superior in smoothness, and the barrier at the interface between the wettability variable layer and the organic EL layer can be reduced. It is thus possible to reduce the drive voltage and increase the emission characteristics such as brightness and emission efficiency. It is also possible to prevent short-circuiting between electrodes.

Further in the present invention, because a wettability variable layer 5 is formed between the first electrode layer 3 and the organic EL layer 8, as exemplified in FIG. 1, the organic EL layer 8 does not become in direct contact with the first electrode layer 3. In addition, the lyophilic region on the surface of the wettability variable layer contains an organopolysiloxane and the liquid repellent region contains a fluorine-containing organopolysiloxane, and the wettability variable layer is made of an organopolysiloxane. The organopolysiloxane has siloxane bonds (—Si—O—) as the main chain, and gives a dense film. Thus, the resulting wettability variable layer is likely a dense film.

Thus, for example, if an acidic material is used as the hole-injecting layer 6, the hole-injecting layer does not become in direct contact with the first electrode layer, and the first electrode layer is protected from the hole-injecting layer by a dense-film wettability variable layer and thus, the damage of the first electrode layer under the influence of the acid contained in the hole-injecting layer can be reduced. It is thus possible to prevent deterioration of the hole-injecting function of the first electrode layer by solubilization of the first electrode layer under the influence of acid and deterioration of the hole-injecting function of the hole-injecting layer by elution of the constituent material of the first electrode layer into the hole-injecting layer. It is thus possible to improve the lifetime characteristics further.

Hereinafter, components of the organic EL element according to the present invention will be described.

1. Wettability Variable Layer

The wettability variable layer according to the present invention is a layer formed on the first electrode layer that changes its wettability under the action of a photocatalyst caused by energy irradiation and is inactive to the energy. The wettability variable layer has, on the surface, a wettability variable pattern comprising a lyophilic region containing an organopolysiloxane formed on the pattern of the first electrode layer and a liquid repellent region containing a fluorine-containing organopolysiloxane formed on the opening of the pattern of the first electrode layer.

The lyophilic region is a region where the contact angle to liquid is smaller than that in the liquid repellent region and the wettability to the organic EL layer-coating solution is favorable. Further, the liquid repellent region is a region where the contact angle to liquid is larger than that in the lyophilic region and the wettability to the organic EL layer-coating solution is unfavorable. A region where the liquid contact angle is smaller by 1° or more than that of the neighboring region is the lyophilic region, while a region where the liquid contact angle is larger by 1° or more than that of the neighboring region is the liquid repellent region.

In the liquid repellent region, the contact angle to a liquid having a surface tension equivalent to that of the organic EL layer-coating solution is preferably over 21°, more preferably 30° or more, and still more preferably 40° or more. Because the liquid repellent region is a region demanding liquid repellency, excessively small liquid contact angle leads to insufficient liquid repellency and possible deposition of the organic EL layer-coating solution in the liquid repellent region.

Further, in the lyophilic region the contact angle to a liquid having a surface tension equivalent to that of the organic EL layer-coating solution is preferably 20° or less, more preferably 15° or less, and still more preferably 10° or less. Excessively large liquid contact angle may make it difficult to spread the organic EL layer-coating solution uniformly, possibly leading to troubles such as local disappearance of the organic EL layer.

The liquid contact angle can be determined by measuring the contact angles to liquids with various surface tensions in a contact angle meter (e.g., CA-Z™, manufactured by Kyowa Interface Science Co., Ltd.) (30 seconds after dropwise placement from microsyringe) or by calculation after plotting the results. Standard wetting index solutions manufactured by Junsei Chemical Co., Ltd. can be used as the liquids having various surface tensions for the measurement.

The liquid repellent region contains a fluorine-containing organopolysiloxane, while the lyophilic region contains an organopolysiloxane. As described above, fluorine is an element having extremely low surface energy, and a substance containing many fluorine atoms has a smaller critical surface tension. Thus, the fluorine content of the liquid repellent region is larger than that of the lyophilic region, and the critical surface tension of the lyophilic region is larger than that of the liquid repellent region. The wettability variable layer has a wettability variable pattern comprising the liquid repellent and lyophilic regions on the surface, and in forming an organic EL layer on the wettability variable layer, it is possible to form the organic EL layer only in the lyophilic region, by utilizing the difference in wettability between the liquid repellent and lyophilic regions.

The fluorine content of the lyophilic region is preferably 50 or less, more preferably 20 or less, and still more preferably 10 or less, with respect to 100 of the fluorine content of the liquid repellent region. The ratio is a value by weight. It is possible to generate large difference in wettability between the liquid repellent and lyophilic regions by adjusting the fluorine content in the range above. Accordingly as described above, it is possible in forming an organic EL layer on the wettability variable layer to form an organic EL layer accurately only in the lyophilic region with low fluorine content and obtain a high-definition pattern of the organic EL layer.

The fluorine content may be determined by any method currently used, specifically by a quantitative method of determining surface fluorine content such as X-ray photoelectron spectroscopy (also called ESCA (Electron Spectroscopy for Chemical Analysis)), fluorescence X-ray analysis or mass spectroscopy.

Examples of the fluorine-containing organopolysiloxanes forming the liquid repellent region include (1) high-strength organopolysiloxanes, prepared by hydrolysis and polycondensation of a substance such as a chloro- or alkoxy-silane for example in sol gel reaction, and (2) organopolysiloxane crosslinked with a reactive silicone superior in water- and oil-repellency and others. Such a fluorine-containing organopolysiloxane is a material that changes its wettability under the action of a photocatalyst caused by energy irradiation and has a main chain resistant to the degradation and decomposition under the action of a photocatalyst, and thus can be used favorably as the liquid repellent region.

In the case of (1), the fluorine-containing organopolysiloxane is preferably a hydrolytic condensate or a co-hydrolytic condensate of one or more silicon compounds represented by the following general formula:

(wherein, "Y" represents an alkyl, fluoroalkyl, vinyl, amino, phenyl or epoxy group; "X" represents an alkoxyl or acetyl group or a halogen when "Y" is a fluoroalkyl group, and "X" represents a fluorine atom when "Y" is an alkyl, vinyl, amino, phenyl or epoxy group; and "n" is an integer of 0 to 3).

The number of carbons of the group "Y" is preferably in the range of 1 to 20. The alkoxyl group "X" is preferably a methoxy, ethoxy, propoxy or butoxy group. Typical examples of the silicon compound represented by the Formula above include those described in JP-A No. 2000-249821 and others.

In particular, the fluorine-containing organopolysiloxane is preferably a polysiloxane containing fluoroalkyl groups. Typical examples of the polysiloxanes containing fluoroalkyl groups include the hydrolytic condensate or co-hydrolytic condensate of one or more fluoroalkylsilanes described in JP-A No. 2000-249821, and generally-called fluorine-based silane-coupling agents may be used.

Use of a polysiloxane containing fluoroalkyl groups leads to drastic increase in liquid repellency of the liquid repellent region, prohibiting formation of the organic EL layer in the liquid repellent region, and allowing formation of the organic EL layer only in the lyophilic region.

It is possible to determine whether the polysiloxane containing fluoroalkyl groups is contained in the liquid repellent region by X-ray photoelectron spectroscopy, Rutherford backscattering spectroscopy, nuclear magnetic resonance spectroscopy or mass spectroscopy.

The reactive silicone used as the fluorine-containing organopolysiloxane in the case of (2) above is, for example, a compound having the skeleton represented by the following Chemical Formula 1:

[Chemical Formula 1]

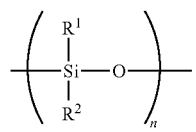

Chemical Formula 1

In the Formula, "n" is an integer of 2 or more; and $R^1$ and $R^2$ each represent a substituted or unsubstituted alkyl, alkenyl, aryl or cyanoalkyl group having 1 to 10 carbon atoms, of which 40% or less by molar ratio is fluorinated phenyl. $R^1$ and $R^2$ are preferably methyl groups, because the reactive silicone compound has the smallest surface energy, and 60% or more of the group is a methyl group by molar ratio. In addition, the polymer has reactive groups containing at least one hydroxyl group at the chain terminals or on the side chains of the molecular chain.

The liquid repellent region may contain a stable organosilicone compound such as dimethylpolysiloxane that does not crosslink, in addition to the fluorine-containing organopolysiloxane.

The lyophilic region is a region having a smaller fluorine content than the liquid repellent region. For example, as shown in FIGS. 2B and 2C, when the wettability variable layer 5 is irradiated with energy such as ultraviolet ray 27 via a photocatalyst treatment layer 24 containing a photocatalyst, the fluorine-containing branched chain of the fluorine-containing organopolysiloxane is decomposed in the UV-irradiated region of the wettability variable layer 5 under the action of the photocatalyst contained in the photocatalyst treatment layer 24, resulting in decrease in fluorine content and change in wettability that leads to decrease in liquid contact angle. Thus, the organopolysiloxane constituting the lyophilic region is for example a decomposition product of the fluorine-containing branched chain of the fluorine-containing organopolysiloxane under the action of the photocatalyst caused by energy irradiation.

Similarly to the liquid repellent region, the lyophilic region may also contain a stable organosilicone compound, such as dimethylpolysiloxane, that does not crosslink in addition to the organopolysiloxane.

The liquid repellent and lyophilic regions may additionally contain, in addition to the fluorine-containing organopolysiloxane and the organopolysiloxan described above, for example, surfactants and additives similar to those described in JP-A No. 2000-249821.

As for the positions of the liquid repellent and lyophilic regions provided, the liquid repellent region is preferably provided on the opening of the pattern of the first electrode layer, while the lyophilic region provided on the pattern of the first electrode layer.

The shape of the pattern in the liquid repellent and lyophilic regions is selected properly according to the shape of the pattern of the first electrode layer. For example, if the first electrode layer is formed in a stripe pattern, the lyophilic region is formed in a stripe pattern according to the stripe pattern of the first electrode layer. Alternatively, if the first electrode layer is formed in a mosaic pattern corresponding to pixels, the lyophilic region may be formed in a stripe pattern or in a mosaic pattern. In any case, the region of the wettability variable layer surface except the lyophilic region is a liquid repellent region.

The wettability variable layer is a layer having a wettability variable pattern comprising liquid repellent and lyophilic regions on the surface, as described above. Normally, the wettability variable layer except the surface lyophilic region has a region having a configuration similar to that of the surface liquid repellent region. Specifically, the wettability variable layer has a region containing a fluorine-containing organopolysiloxane, in addition to the surface lyophilic region.

The thickness of the wettability variable layer is not particularly limited, as long as the wettability variable pattern can be formed and the resulting film does not inhibit transportation of holes or electrons. Specifically, the thickness of the wettability variable layer is preferably 20 nm or less, particularly preferably in the range of 1 nm to 15 nm. When the thickness of the wettability variable layer is in the range above, electric charges are tunnel-injected by the external electric field.

The method of forming the wettability variable layer will be described below in the section of "B. Method of producing an organic EL element", and thus, description thereof is omitted.

2. Organic EL Layer

The organic EL layer used in the present invention is formed on the lyophilic region of the wettability variable layer and comprises at least a light-emitting layer.

The organic EL layer is made of one or more organic layers including at least a light-emitting layer. Specifically, the organic EL layer is a layer containing at least a light-emitting layer that has a layer structure comprising one or more organic layers. Normally, if an organic EL layer is formed by coating in wet method, it is difficult to laminate multiple layers because of solvents, and thus, organic EL layers having one or two organic layers are formed in many cases. However, it is possible to increase the number of the layers by modifying the organic materials so that they become differently soluble in solvent and by using vacuum deposition in combination.

The organic layers constituting the organic EL layers other than the light-emitting layer include charge injecting/transporting layers such as a hole injecting/transporting layer and an electron injecting/transporting layer. The organic layer is, for example, a layer that increases the recombination efficiency by preventing penetration of holes or electrons like the carrier block layer and by enclosing the excitons in the light-emitting layer to prevent diffusion of excitons.

Hereinafter, components of the organic EL layer will be described.

(1) Light-Emitting Layer

The light-emitting layer according to the present invention has a function to emit light by providing the site for recombination of electrons and holes.

The light-emitting material for use in the light-emitting layer is not particularly limited, as long as it emits fluorescence or phosphorescence. The light-emitting material may have a hole-transporting or electron-transporting capability. Examples of the light-emitting materials include colorant-based materials, metal complex-based materials, and polymer-based materials.

Typical examples of the colorant-based materials include cyclopendamine derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perynone derivatives, perylene derivatives, oligothiophene derivatives, trifumanylamine derivatives, oxadiazoledimers, and pyrazoline dimers.

Typical examples of the metal complex-based materials include aluminum quinolinol complexes, benzoquinolinol beryllium complexes, benzoxazole zinc complexes, benzothiazole zinc complexes, azo methyl zinc complexes, porphyrin zinc complexes, europium complexes, and metal complexes having Al, Zn, Be or a rare earth metal such as Tb, Eu, or Dy as the central metal and oxadiazole, thiadiazole, phenylpyridine, phenylbenzimidazole, or quinoline structures as the ligands.

Typical examples of the polymer-based materials include polyparaphenylene vinylene derivatives, polythiophene derivatives, polyparaphenylene derivatives, polysilane derivatives, polyacetylene derivatives, polyfluorene derivatives, polyvinyl carbazole derivatives, the colorant-based materials above, and polymerized metal complex-based materials.

Among the materials above, the light-emitting material for use is preferably the above-mentioned polymer-based material, because of the advantage that it is possible to form a light-emitting layer accurately by using the difference in wettability between the lyophilic and liquid repellent regions.

The light-emitting material may contain a dopant added for improvement in emission efficiency and modification of the emission wavelength. Examples of the dopant include perylene derivatives, coumarin derivatives, rubrene derivatives, quinacridone derivatives, squalium derivatives, porphylene derivatives, styryl-based colorants, tetracene derivatives, pyrazoline derivatives, decacyclene, and phenoxazone.

(2) Charge Injecting/Transporting Layer

The charge injecting/transporting layer according to the present invention has a function to transport electric charges reliably from the electrode layer to the light-emitting layer. The charge injecting/transporting layers include a hole injecting/transporting layer of injecting and transporting holes reliably into the light-emitting layer and an electron injecting/transporting layer injecting and transporting electrons reliably into the light-emitting layer. Hereinafter, the hole and electron injecting/transporting layers will be described separately.

(i) Hole Injecting/Transporting Layer

The hole injecting/transporting layer according to the present invention may be a hole-injecting layer having a hole-injecting function of injecting the holes injected from the anode reliably into the light-emitting layer, a hole-transporting layer having a hole-transporting function of transporting the holes injected from the anode into the light-emitting layer, a laminate of the hole-injecting layer and the hole-transporting layer, or a single layer having both hole-injecting and hole-transporting functions.

In the present invention, the organic EL layer preferably contains at least a light-emitting layer and a hole injecting/transporting layer, and the wettability variable layer, the hole injecting/transporting layer and the light-emitting layer are preferably formed in that order. In the case, the hole injecting/transporting layer is preferably a hole-injecting layer. It is because, as described above, if an acidic material is used for the hole-injecting layer, because the first electrode layer is protected from the hole-injecting layer by the wettability variable layer as it is prevented from direct contact with the first electrode layer, it is possible to reduce the damage of the first electrode layer under the influence of the acid contained in the hole-injecting layer. In addition, presence of the hole injecting/transporting layer formed between the wettability variable layer and the light-emitting layer stabilizes hole injection into the light-emitting layer and raises the emission efficiency. Additionally, generally in production of an organic EL element, it is preferable to use a first electrode layer as the anode, and laminate the anode, a hole injecting/transporting layer and a light-emitting layer in that order, because it is possible to prepare the organic EL element more reliably by laminating these layers from the anode side.

The material for the hole injecting/transporting layer is not particularly limited, as long as it is a material transporting the holes injected from the anode reliably into the light-emitting layer. Examples thereof include the compounds exemplified as the light-emitting material for the light-emitting layer, as well as oxides such as vanadium oxide, molybdenum oxide, ruthenium oxide, and aluminum oxide; phenylamines, starburst amines, phthalocyanines, amorphous carbon, polyaniline, polythiophene, and polyphenylene vinylene derivatives. The conductive polymers such as polyaniline, polythiophene and polyphenylene vinylene derivatives may be doped with an acid. Typical examples thereof include 4,4'-bis[N-(1-naphthyl)-N-phenyl-amino]-biphenyl (α-NPD), 4,4',4''-tris(N,N-diphenyl-amino)-triphenylamine (TDATA), 4,4',4''-tris[N-(3-methylphenyl)-N-phenyl-amino]-triphenylamine (MTDATA), polyvinylcarbazole (PVCz), and poly(3,4-ethylenedioxythiophene)/polystyrene-sulfonic acid (PEDOT/PSS).

The material for the hole injecting/transporting layer is preferably an acidic material, specifically a material having a pH of less than 7. As described above, if an acidic material is used for the hole injecting/transporting layer, the present invention is useful, because it is possible to reduce the damage of the first electrode layer under the influence of the acid contained in the hole injecting/transporting layer. The acidic material is, for example, a conductive polymer doped with an acid in an excessive amount, and specifically, PEDOT excessively doped with PSS is used favorably.

The material for the hole injecting/transporting layer is preferably, relatively high in resistance. It is because excessively low resistance may lead to crosstalk. Among the materials above, PEDOT/PSS for example is used favorably as the high-resistance material. A commercially available aqueous dispersion of high-resistance PEDOT/PSS includes, for example, Baytron P CH-8000 manufactured by H. C. Stark, Inc H. C. Stark, Inc.

The thickness of the hole injecting/transporting layer is not particularly limited, as long as the function is exhibited sufficiently. Specifically, the thickness is preferably in the range of 5 nm to 200 nm, and more preferably in the range of 10 nm to 100 nm.

(ii) Electron Injecting/Transporting Layer

The electron injecting/transporting layer according to the present invention may be an electron-injecting layer having an electron-injecting function of injecting the electrons injected from the cathode into the light-emitting layer, an electron-transporting layer having an electron-transporting function of transporting the electrons injected from the cathode into the light-emitting layer, a laminate of the electron-injecting layer and the electron-transporting layer, or a single layer having both electron-injecting and electron-transporting functions.

The material for the electron-injecting layer is not particularly limited, as long as it is a material stabilizing electron injection into the light-emitting layer. Examples thereof include alkali metals and alkali-earth metals such as Ba, Ca, Li, Cs, Mg and Sr; alkali metal alloys such as aluminum lithium alloy; alkali metals or alkali-earth metal oxides such as magnesium oxide and strontium oxide; alkali metals or alkali-earth metal fluorides such as magnesium fluoride, calcium fluoride, strontium fluoride, barium fluoride, lithium fluoride, and cesium fluoride; and alkali metal organic complexes such as polymethyl methacrylate-sodium polystyrenesulfonate. These materials may be also used as a laminate such as of Ca/LiF.

Among them, alkali-earth metal fluorides are preferable. The alkali-earth metal fluorides have high melting points, permitting improvement in heat resistance.

The material for the electron-transporting layer is not particularly limited, as long as it is a material allowing transportation of the electrons injected from the cathode or electron-injecting layer into the light-emitting layer. Examples thereof include vasocuproine (BCP), phenanthroline derivatives such as bathophenanthroline (Bpehn), triazole derivatives, oxadiazole derivatives, and aluminum quinolinol complexes such as tris(8-quinolinol) aluminum complex (Alq3) Generally, if a polymer-based material is used as the light-emitting layer, use of a low-molecular weight-based material as the electron-transporting layer may lead to improvement in hole-blocking properties.

The material for the single layer having both electron-injecting and electron-transporting functions is, for example, an electron-transporting material doped with an alkali or alkali-earth metal such as Li, Cs, Ba or Sr. The electron transporting material is, for example, vasocuproine (BCP) or a phenanthroline derivative such as bathophenanthroline (Bpehn). The molar ratio of the electron transporting material to the doped metal is preferably in the range of 1:1 to 1:3, more preferably in the range of 1:1 to 1:2. The electron transporting material doped with an alkali metal or alkali-earth metal has relatively high electron-transferring efficiency and has a transmission higher than that of pure metals.

The material for the electron injecting/transporting layer preferably has relatively high resistance, because excessively low resistance may lead to crosstalk.

The thickness of the electron-injecting layer is not particularly limited, as long as its function is exhibited sufficiently. Specifically, the thickness is preferably in the range of 0.1 nm to 200 nm, and more preferably in the range of 0.5 nm to 100 nm.

Further, the thickness of the electron-transporting layer is not particularly limited, as long as its function is exhibited sufficiently. Specifically, the thickness is preferably in the range of 1 nm to 100 nm, and more preferably in the range of 1 nm to 50 nm.

Alternatively, the thickness of the single layer having both an electron-injecting function and an electron-transporting function is not particularly limited, as long as its function is exhibited sufficiently. Specifically, the thickness is preferably in the range of 0.1 nm to 100 nm, and more preferably in the range of 0.1 nm to 50 nm.

3. First Electrode Layer

The first electrode layer used in the present invention is a layer formed on a substrate in pattern.

The first electrode layer may be an anode or a cathode. Generally in production of an organic EL element, it is possible to prepare the organic EL element more reliably by laminating from the anode side, and thus, the first electrode layer is preferably an anode.

The material for the first electrode layer is not particularly limited, as long as it is a conductive material. For example, if the organic EL element shown in FIG. 1, is an bottom-emission type device, or if energy is irradiated from the substrate side during formation of a wettability variable pattern in the production process for the organic EL element, the first electrode layer is preferably transparent. Favorable examples of the conductive and transparent materials include In—Zn—O (IZO), In—Sn—O (ITO), ZnO—Al, and Zn—Sn—O. Alternatively, if the organic EL element shown in FIG. 1 is a top emission-type element, the first electrode layer may not be required to be transparent. In this case, a metal may be used as the conductive material, and typical examples thereof include Au, Ta, W, Pt, Ni, Pd, Cr, Al alloys, Ni alloys, and Cr alloys.

Any one of common electrode film-forming methods may be used as the method of forming the first electrode layer, and examples thereof include sputtering, ion plating, and vacuum deposition. The method of patterning the first electrode layer is, for example, photolithography.

4. Second Electrode Layer

The second electrode layer for use in the present invention carries charges opposite in polarity to the first electrode layer. The second electrode layer may be an anode or a cathode. Generally in production of an organic EL element, it is possible to produce the organic EL element more reliably by laminating the layers from the anode side, and for that reason, the second electrode layer is preferably a cathode.

The material for the second electrode layer is not particularly limited, as long as it is a conductive material. For example, if the organic EL element shown in FIG. 1 is a top emission-type element, the second electrode layer is preferably transparent. Alternatively, if the organic EL element shown in FIG. 1 is a bottom emission-type element, the second electrode layer may not be required to be transparent. The conductive material is the same as that described above in the section for the first electrode layer, and description thereof is omitted.

In addition, the method of forming the second electrode layer is the same as that for the first electrode layer, and description thereof is omitted.

5. Substrate

The substrate according to the present invention supports layers such as a first electrode layer, a wettability variable layer, an organic EL layer, and a second electrode layer. For example, if the organic EL element shown in FIG. 1 is a bottom emission-type element, or if energy is irradiated from the substrate side during formation of a wettability variable pattern in the production process of the organic EL element, the substrate is preferably transparent. Examples of the transparent substrates include quartz, and glass. Alternatively, if the EL element shown in FIG. 1 is a top emission-type element, the substrate may not be required to be transparent. In this case, in addition to the materials above, metals such as aluminum and the alloys thereof, plastics, and woven and nonwoven fabrics may be used as the substrates.

6. Insulation Layer

In the present invention, the insulation layer may be formed on the opening of the pattern of the first electrode layer on the substrate. The insulation layer is formed for electric conduction between neighboring patterns of the first electrode layer and for prevention of electric conduction between the first and second electrode layers. The region where the insulation layer is formed is the non-light-emitting region.

The insulation layer is a layer formed on the substrate and in the opening of the pattern of the first electrode layer, normally covering the terminal of the pattern of the first electrode layer.

The material for the insulation layer is not particularly limited, as long as it is insulative. In particular, the material for the insulation layer preferably reflects or absorbs the energy irradiated during formation of the wettability variable pattern in the production process of the organic EL element.

It is because, in this case, the patterned irradiation is possible in forming the wettability variable pattern by irradiating the entire surface with energy form the substrate side. Thus, there is no need during energy irradiation for use of a photomask or imaging irradiation with laser beam. Examples of the materials for the insulation layers include photosensitive polyimide resins, photocuring resins such as acrylic resins, thermosetting resins, and inorganic materials.

Common methods such as photolithography and printing can be used as the methods of forming the insulation layer.

B. Method of Producing Organic EL Element

The method of producing the organic EL element according to the present invention comprises: a wettability variable layer-forming step of forming a wettability variable layer, which changes its wettability under the action of a photocatalyst caused by energy irradiation, on a substrate having an electrode layer formed; a wettability variable pattern-forming step of forming a wettability variable pattern of lyophilic and liquid repellent regions on the wettability variable layer surface, wherein the pattern is formed by providing a photocatalyst treatment layer substrate, which has a photocatalyst treatment layer containing at least a photocatalyst formed on a base body, at a distance allowing the action of the photocatalyst caused by energy irradiation to reach on the wettability variable layer and by irradiating the substrate with energy in pattern; and an organic EL layer-forming step of forming an organic EL layer containing at least a light-emitting layer on the lyophilic region.

The method of producing the organic EL element according to the present invention will be described below with reference to drawings.

FIGS. 2A to 2E are a process chart showing an example of the method of producing the organic EL element according to the present invention. First, an electrode layer 3 is formed in pattern on a substrate 2; an insulation layer 4 is then formed on the opening of the pattern of the electrode layer 3; and a wettability variable layer 5 is formed on the electrode layer 3 and the insulation layer 4 (FIG. 2A, wettability variable layer-forming step).

Then as shown in FIG. 2B, a photocatalyst treatment layer substrate 21 comprising a base body 22, a light shielding part 23 formed in pattern on the base body 22, and a photocatalyst treatment layer 24 formed on the base body 22 as it covers the light shielding part 23 is prepared. The photocatalyst treatment layer substrate 21 is then provided on the wettability variable layer 5 in a manner such that its photocatalyst treatment layer 24 facing the layer 5, and ultraviolet ray 27 is irradiated. As shown in FIG. 2C, irradiation with ultraviolet ray 27 leads to change in the wettability of the UV irradiation region of the wettability variable layer 5 toward decrease in liquid contact angle, under the action of the photocatalyst contained in the photocatalyst treatment layer 24. The region where the wettability is changed toward decrease in liquid contact angle will be referred to as lyophilic region 11. In the region where no ultraviolet ray is irradiated, the wettability remains unchanged, and the region where there is no change in wettability will be referred to as liquid repellent region 12. The photocatalyst treatment layer substrate 21 is then separated from the wettability variable layer 5. In this way, wettability variable pattern having a lyophilic region 11 and a liquid repellent region 12 is formed on the surface of the wettability variable layer 5. FIGS. 2B and 2C show the wettability variable pattern-forming step.

The wettability variable layer 5 changes its wettability under the action of a photocatalyst caused by energy irradiation, and the UV-irradiated lyophilic region 11 and the UV-unirradiated liquid repellent region 12 are different in wettability from each other.

A hole-injecting layer-coating solution is then coated on the wettability variable pattern having lyophilic regions 11 and liquid repellent regions 12, forming a hole-injecting layer 6 only in the lyophilic regions 11 by using the difference in wettability. A light-emitting layer-coating solution is coated on the hole-injecting layer 6, forming a light-emitting layer 7 on the hole-injecting layer 6 by using the difference in wettability between the hole-injecting layer 6 surface and the liquid repellent region 12 (FIG. 2D, organic EL layer-forming step). In this way, an organic EL layer 8 is given.

Then, a counter electrode layer 9 is formed on the organic EL layer 8 (FIG. 2E).

At that time, for example, a top-emission organic EL element is obtained if the counter electrode layer 9 is a transparent electrode, while a bottom-emission organic EL element is obtained if the electrode layer 3 is a transparent electrode.

In the present invention, a wettability variable pattern of lyophilic and liquid repellent regions is formed on the surface of a wettability variable layer, while energy is irradiated onto the wettability variable layer via a photocatalyst-containing photocatalyst treatment layer. The organic EL layer is patterned by using the varied wettability pattern formed on the wettability variable layer surface. It is thus possible to pattern the organic EL layer easily without requiring a complicated patterning step or an expensive vacuum processing facility.

It is also possible according to the present invention to change the wettability of the no-photocatalyst-containing wettability variable layer under the action of the photocatalyst, by the energy pattern irradiated on the wettability variable layer via the photocatalyst-containing photocatalyst treatment layer. In addition, because the photocatalyst treatment layer substrate having a photocatalyst treatment layer is separated from the wettability variable layer after the wettability variable pattern is formed on the wettability variable layer surface, the organic EL element itself does not contain the photocatalyst. Thus, the photocatalyst is contained in the photocatalyst treatment layer and not in the wettability variable layer. It is thus possible to improve the smoothness of the wettability variable layer and to reduce the barrier at the interface between the wettability variable layer and the organic EL layer. It is possible in this way to reduce the drive voltage and improve the emission characteristics such as brightness and emission efficiency. It is also possible to prevent short circuiting between the electrodes.

Further according to the present invention, because a wettability variable layer is formed on the electrode layer and an organic EL layer additionally on the wettability variable layer, the organic EL layer is not formed directly on the electrode layer. Therefore, for example in FIGS. 2A to 2E, if a hole-injecting layer is formed by using an acidic material, because the hole-injecting layer is not formed directly on the electrode layer, the electrode layer is protected from the hole-injecting layer by the wettability variable layer and the damage of the electrode layer under the influence of the acid contained in the hole-injecting layer can be decreased.

Hereinafter, steps in the production method for the organic EL element will be described respectively.

1. Wettability Variable Layer-Forming Step

The wettability variable layer-forming step according to the present invention is a step of forming a wettability variable layer, wherein changes its wettability under the action of a photocatalyst caused by energy irradiation, on a substrate having an electrode layer formed.

The wettability variable layer for use in the present invention is not particularly limited, as long as it changes its wettability under the action of a photocatalyst caused by energy irradiation. The material for the wettability variable layer is not particularly limited, as long as it is a material that changes its wettability under the action of a photocatalyst caused by energy irradiation and has a main chain resistant to degradation and decomposition under the action of the photocatalyst. Examples of the materials used for the wettability variable layer include organopolysiloxanes such as (1) high-strength organopolysiloxanes prepared for example by hydrolysis and polycondensation of chloro- or alkoxy-silane in sol gel reaction, and (2) organopolysiloxanes superior in water-repellency and oil-repellency, prepared by crosslinking of a reactive silicone.

in the case of (1) above, a hydrolytic condensate or co-hydrolytic condensate organopolysiloxane of one or more silicon compounds represented by the following general formula:

(wherein, "Y" represents an alkyl, fluoroalkyl, vinyl, amino, phenyl or epoxy group; "X" represents an alkoxyl or acetyl group or a halogen; and "n" is an integer of 0 to 3), is used favorably. The number of carbons of the group "Y" is preferably in the range of 1 to 20, and the alkoxyl group "X" is preferably a methoxy, ethoxy, propoxy or butoxy group. Typical examples of the silicon compounds represented by the formula above include those described in JP-A No. 2000-249821.

In particular, polysiloxanes containing fluoroalkyl groups can be used favorably. Typical examples of the polysiloxanes containing fluoroalkyl groups include the hydrolytic condensate or co-hydrolytic condensate of one or more fluoroalkyl-silanes described in JP-A No. 2000-249821, and commonly-called fluorine-based silane-coupling agents can be used.

Use of a polysiloxane containing fluoroalkyl groups leads to drastic increase in liquid repellency of the wettability variable layer, and it is thus possible to prevent filming of the organic EL layer in the liquid repellent region where the wettability is unchanged and to allow filming of the organic EL layer only in the lyophilic region where the wettability is changed toward decrease in liquid contact angle.

Presence of the polysiloxane containing fluoroalkyl groups in the wettability variable layer can be confirmed by X-ray photoelectron spectroscopy, Rutherford backscattering spectroscopy, nuclear magnetic resonance spectroscopy or mass spectroscopy.

The reactive silicones (2) include compounds having the skeleton represented by the following Chemical Formula 1.

[Chemical Formula 2]

Chemical Formula 1

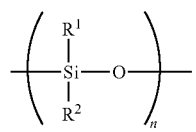

In the Formula, "n" is an integer of 2 or more; and $R^1$ and $R^2$ each represent a substituted or unsubstituted alkyl, alkenyl, aryl group or cyanoalkyl group having 1 to 10 carbon atoms, 40% or less by molar ratio of which is vinyl, phenyl, or a halogenated phenyl. $R^1$ and $R^2$ are preferably both methyl groups, because the surface energy is smallest, and a methyl group content of 60% or more by molar ratio is preferable.

The chain terminals or the side chains have at least one reactive group such as hydroxyl group in the molecular chains.

The organopolysiloxane may be used in a mixture with a stable organosilicone compound that does not crosslink such as dimethylpolysiloxane.

Various materials including organopolysiloxanes may be used for the wettability variable layer in this way, and the wettability variable layer particularly preferably contains fluorine. In such a case, the fluorine content in the wettability variable layer surface preferably decreases after energy irradiation under the action of a photocatalyst caused by energy irradiation.

Because fluorine has extremely low surface energy, the surface of a much fluorine-containing substance has a critical surface tension significantly smaller. Therefore, the critical surface tension of low-fluorine content region is higher than that of the high-fluorine content region.

Such a wettability variable layer gives a wettability variable pattern having energy-irradiated low-fluorine content regions (lyophilic regions) and energy-unirradiated high-fluorine content regions (liquid repellent regions) after patterned irradiation with energy. Thus, the wettability variable layer containing fluorine is advantageous for preparation of the wettability variable pattern.

The wettability variable layer may contain, in addition to the materials described above, surfactants, additives and the like similar to those described, for example, in JP-A No. 2000-249821.

Such a wettability variable layer can be prepared by preparing a wettability variable layer-coating solution by dissolving or dispersing the materials described above, as needed with other additives, in solvent and applying the wettability variable layer-coating solution on an electrode layer.

The solvent for use then in the wettability variable layer-coating solution is not particularly limited, as long as it can be mixed with the materials described above and does not affect the patterning efficiency by whitening and other phenomena. Examples of the solvents include alcohols such as methanol, ethanol, isopropanol and butanol; acetone, acetonitrile, ethylene glycol monomethylether, ethylene glycol dimethylether, ethylene glycol monoethylether, ethylene glycol monoethylether acetate, diethylglycol monomethylether, diethylglycol monoethylether, diethylglycol monoethylether acetate, propylene glycol monomethylether, propylene glycol monoethylether, propylene glycol monomethylether acetate, methyl acetate, ethyl acetate, butyl acetate, toluene, xylene, methyl lactate, ethyl lactate, ethyl pyruvate, methyl 3-methoxypropionate, ethyl 3-ethoxypropionate, dimethylformamide, dimethylsulfoxide, dioxane, ethyleneglycol, hexamethyl triphosphate amide, pyridine, tetrahydrofuran, and N-methylpyrrolidinone. These solvents may be used as a mixture of two or more solvents.

Examples of the method of applying the wettability variable layer-coating solution include spin coating, inkjet ejection, casting, LB method, dispenser method, microgravure coating, gravure coating, bar coating, roll coating, wire bar coating, dip coating, flexographic printing, offset printing, and screen printing.

After application of the wettability variable layer-coating solution, the coated film may be dried. The drying method is not particularly limited, as long as a uniform wettability variable layer can be formed, and the film may be dried by using a hot plate, an infrared ray heater, or an oven.

Other properties of the wettability variable layer are the same as those described above for the wettability variable layer in the section of "A. organic EL element", and thus, description thereof is omitted.

2. Wettability Variable Pattern-Forming Step

The wettability variable pattern-forming step in the present invention is a step of forming a wettability variable pattern of lyophilic and liquid repellent regions on the wettability variable layer surface, wherein the pattern is formed by providing a photocatalyst treatment layer substrate, which has a photocatalyst treatment layer, containing at least a photocatalyst, formed on a base body at a distance allowing the action of the photocatalyst caused by energy irradiation to reach on the wettability variable layer and by irradiating the substrate with energy in pattern.

Hereinafter, the photocatalyst treatment layer substrate, the positions of the photocatalyst treatment layer substrate and the wettability variable layer, the energy irradiation, and the wettability variable pattern will be described.

(1) Photocatalyst Treatment Layer Substrate

In the present invention, informing a wettability variable pattern on the surface of the wettability variable layer that changes its wettability under the action of a photocatalyst caused by energy irradiation, a photocatalyst treatment layer substrate having a photocatalyst-containing photocatalyst treatment layer is used to make the photocatalyst act on the wettability variable layer. It is possible to form a wettability variable pattern on the surface of the wettability variable layer by providing the photocatalyst treatment layer substrate on the wettability variable layer at a particular distance and irradiating the substrate with energy in pattern.

The photocatalyst treatment layer substrate for use in the present invention has a base body and a photocatalyst treatment layer formed on the base body. A light shielding part may be formed additionally in pattern on the photocatalyst treatment layer substrate. Hereinafter, the photocatalyst treatment layer, the base body and the light shielding part will be described.

(i) Photocatalyst Treatment Layer

The photocatalyst treatment layer used in the present invention contains a photocatalyst. The photocatalyst treatment layer is not particularly limited, as long as it is configured in such a manner that the photocatalyst contained in the photocatalyst treatment layer can change the wettability of the wettability variable layer surface. The photocatalyst treatment layer may contain, for example, a photocatalyst and a binder, or only a photocatalyst. A photocatalyst treatment layer only containing a photocatalyst leads to improved efficiency of the change in wettability of the wettability variable layer surface and is thus advantageous from the point of production cost such as by shortening of the processing period. Alternatively, a photocatalyst treatment layer containing a photocatalyst and a binder has an advantage that the photocatalyst treatment layer can be formed easily.

Example of the photocatalysts for use in the present invention include optical semiconductors such as titanium dioxide ($TiO_2$), zinc oxide (ZnO), tin oxide ($SnO_2$), strontium titanate ($SrTiO_3$), tungsten oxide ($WO_3$), bismuth oxide ($Bi_2O_3$), and iron oxide ($Fe_2O_3$). These photocatalysts may be used alone or as a mixture of two or more.

In the present invention, titanium dioxide, which has large band gap energy and is chemically stable, nontoxic and readily available, is used favorably. There are anatase and rutile titanium dioxide products and any one of them may be used. In particular, anatase titanium dioxide is preferable. The anatase titanium dioxide has an excitation wavelength at 380 nm or less.

Examples of the anatase titanium dioxides include hydrochloric acid-deflocculated anatase titania sols (STS-02, manufactured by Ishihara Sangyo Kaisha, Ltd. (average diameter: 7 nm) and ST-K01, manufactured by Ishihara Sangyo Kaisha, Ltd.), and nitric acid-deflocculated anatase titania sol (TA-15, manufactured by Nissan Chemical Industries Co., Ltd. (average diameter: 12 nm)).

Because smaller particle diameter is effective for photocatalytic reaction, the particle diameter thereof is preferably smaller. Specifically, the average diameter of the photocatalyst is preferably 50 nm or less, and particularly preferably 20 nm or less.

The action mechanism of the photocatalyst represented by titanium dioxide in the photocatalyst treatment layer is yet to be understood, but it seems that the photocatalyst initiates oxidation-reduction reaction by energy irradiation, generating active oxygen species such as superoxide radical ($.O_2^-$) and hydroxy radical (.OH) and the generated active oxygen species cause change in the chemical structure of organic substances. In the present invention, the active oxygen species are considered to act on the organic substances in the wettability variable layer provided close to the photocatalyst treatment layer.

If the photocatalyst treatment layer contains a photocatalyst and a binder, the binder for use is preferably a compound having high bond energy so that the main skeleton is resistant to decomposition caused by photoexcitation of the photocatalyst. The binder is, for example, an organopolysiloxane.

Alternatively, an amorphous silica precursor may be used as the binder. The amorphous silica precursor is represented by a general formula $SiX_4$, and silicon compounds wherein "X" represents a halogen or a methoxy, ethoxy, acetyl or other group, the hydrolysate silanols thereof, and polysiloxanes having an average molecular weight of 3000 or less are favorable. Typical examples thereof include tetraethoxysilane, tetraisopropoxysilane, tetra-n-propoxysilane, tetrabutoxysilane, and tetramethoxysilane. These compounds may be used alone or as a mixture of two or more.

If the photocatalyst treatment layer contains a photocatalyst and a binder, the content of the photocatalyst in the photocatalyst treatment layer may be in the range of 5 wt % to 60 wt %, but is preferably in the range of 20 wt % to 50 wt %.

The photocatalyst treatment layer may contain, in addition to the photocatalyst and binder, a surfactant. Typical examples of the surfactants include hydrocarbon surfactants such as NIKKOL BL, BC, BO, and BB series products of Nikko Chemicals Co., Ltd.; and fluorine- or silicone-based nonionic surfactants such as ZONYL FSN™ and FSO™ manufactured by Du Pont Kabushiki Keisha and Company, Surflon S-141™ and 145™ manufactured by Asahi Glass Co., Ltd., Megafac F-141™ and 144™ manufactured by Dainippon Ink and Chemicals, Inc., Ftergent F-200™ and F251™ manufactured by Neos Co., Ltd., Unidyne DS-401™ and 402™ manufactured by Daikin Industries Ltd., and Fluorad FC-170™, 176™ manufactured by 3M Co., Ltd. A cationic, anionic or amphoteric surfactant may also be used.

The photocatalyst treatment layer may contain, in addition to the surfactant above, oligomers and polymers such as polyvinylalcohol, unsaturated polyester, acrylic resins, polyethylene, diallyl phthalate, ethylene propylene diene monomer, epoxy resins, phenol resins, polyurethane, melamine resins, polycarbonates, polyvinyl chloride, polyamide, polyimide, styrene butadiene rubbers, chloroprene rubbers, polypropylene, polybutylene, polystyrene, polyvinyl acetate, polyester, polybutadiene, polybenzimidazole, polyacrylonitrile, epichlorohydrin, polysulfide and polyisoprene.

The thickness of the photocatalyst treatment layer is preferably in the range of 0.05 µm to 10 µm.

As for the wettability of the photocatalyst treatment layer surface, the surface may be lyophilic or liquid repellent.

Examples of the methods of forming a photocatalyst treatment layer containing only a photocatalyst include vacuum film-forming methods such as CVD, sputtering and vacuum deposition. Such a vacuum film-forming method gives a uniform film of the photocatalyst treatment layer containing only a photocatalyst. It is possible in this way to change the wettability of the wettability variable layer surface uniformly. Because the photocatalyst treatment layer contains only a photocatalyst, it is also possible to change the wettability of the wettability variable layer surface efficiently, compared to the case where the binder is used additionally.

The method of forming a photocatalyst treatment layer containing only a photocatalyst is, for example, if the photocatalyst contains titanium dioxide, a method of forming a film of amorphous titania on a base body and converting the amorphous titania into crystalline titania by baking.

The amorphous titania can be obtained, for example, by hydrolysis and dehydration condensation of an inorganic titanium salt such as titanium tetrachloride or titanium sulfate or hydrolysis and dehydration condensation of an organic titanium compound such as tetraethoxytitanium, tetraisopropoxytitanium, tetra-n-propoxytitanium, tetrabutoxytitanium or tetramethoxytitanium in the presence of acid. Then, the amorphous titania can be converted to anatase titania by sintering at 400° C. to 500° C., and then to rutile titania by sintering at 600° C. to 700° C.

If an organopolysiloxane is used as the binder, the photocatalyst treatment layer containing a photocatalyst and a binder may be produced, by forming a photocatalyst treatment layer-coating solution by dispersing the photocatalyst and the binder organopolysiloxane in a solvent, together with other additives as needed, and applying the photocatalyst treatment layer-coating solution on a base body. If a UV-curing component is contained as the binder, the layer after application may be subjected to hardening treatment by ultraviolet irradiation.

The solvent used then is preferably an alcoholic organic solvent such as ethanol or isopropanol. A common method such as spin coating, spray coating, dip coating, roll coating or bead coating may be used as the application method.

If an amorphous silica precursor is used as the binder, the photocatalyst treatment layer containing a photocatalyst and a binder is produced by a method of preparing a photocatalyst treatment layer-coating solution by dissolving photocatalyst particles and an amorphous silica precursor uniformly in a nonaqueous solvent, coating the photocatalyst treatment layer-coating solution on a base body, hydrolyzing the amorphous silica precursor to silanol with moisture in air, and dehydrating and polycondensing the resulting product at a normal temperature. Dehydration polycondensation of silanol at 100° C. or higher leads to increase in the polymerization degree of silanol and improvement in film surface strength.

Figure 3A:
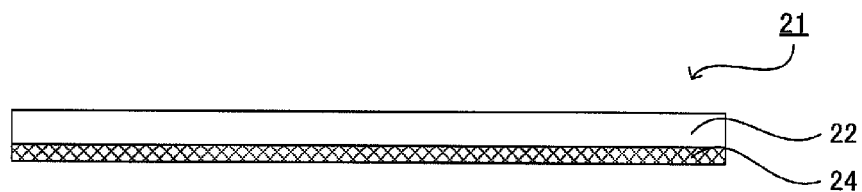
FIGS. 3A and 3B are each a schematic sectional view illustrating an example of the photocatalyst treatment layer substrate for use in the present invention.
Figure 3B:
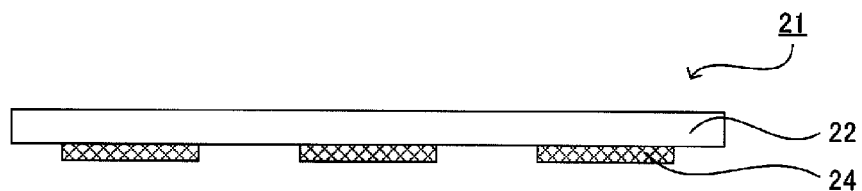

As for the position of the photocatalyst treatment layer formed, for example, the photocatalyst treatment layer 24 may be formed on the entire surface of the base body 22 as shown in FIG. 3A, or alternatively, the photocatalyst treatment layer 24 may be formed in pattern on the base body 22 as shown in FIG. 3B.

If the photocatalyst treatment layer is formed in pattern, there is no need for providing the photocatalyst treatment layer on the wettability variable layer at a particular distance and pattern irradiation by using a photomask during energy irradiation, and the wettability of the wettability variable layer surface can be modified by irradiation of the entire surface. Because practically, only the wettability of the wettability variable layer surface facing the photocatalyst treatment layer is changed, the direction of energy irradiation is not particularly limited, as long as the energy is irradiated into the region where the photocatalyst treatment layer and the wettability variable layer face each other. The irradiation energy is also not limited to parallel light.

The method of patterning the photocatalyst treatment layer is not particularly limited, and is, for example, photolithography.

(ii) Base Body

The base body used for the photocatalyst treatment layer substrate may be preferably transparent, depending on the direction of energy irradiation described below and the direction of the light emission from the obtained organic EL element.

For example, if the organic EL element shown in FIG. 2E is a top emission type and the substrate or electrode layer in the organic EL element is translucent, the energy should be irradiated inevitably in the direction from the photocatalyst treatment layer substrate. Alternatively, if a light shielding part 23 is formed in pattern on the photocatalyst treatment layer substrate 21 and energy irradiation is performed in pattern by using the light shielding part 23, as shown in FIG. 2B, the energy should be irradiated from the photocatalyst treatment layer substrate side. Thus in such a case, the base body should be transparent.

On the other hand, if the organic EL element shown in FIG. 2E is a bottom emission type, the energy should be irradiated from the organic EL element substrate side. Thus in such a case, the base body needs not to be transparent.

The base body may be a flexible material such as resin film or a non-flexible material such as glass plate.

The base body is not particularly limited, but, because the photocatalyst treatment layer substrate is used repeatedly, a material having a particular strength and having the surface favorably adhesive to the photocatalyst treatment layer is used favorably. Typical examples of the materials for the base body include glass, ceramics, metals, and plastics.

An anchor layer may be formed additionally on the base body, for improvement in adhesion between the base body surface and the photocatalyst treatment layer. Examples of the materials for the anchor layer include silane- and titanium-based coupling agents.

(iii) Light Shielding Part The photocatalyst treatment layer substrate used in the present invention may have light shielding parts formed in pattern. When a photocatalyst treatment layer substrate having patterned light shielding parts is used, there is no need for use of a photomask or imaging irradiation with laser beam during energy irradiation. Thus in such a case, there is no need for adjustment of the positions of the photocatalyst treatment layer substrate and the photomask, and thus, the production process is simplified and additionally, economically advantageous because there is no need for an expensive apparatus for imaging irradiation.

Figure 4:
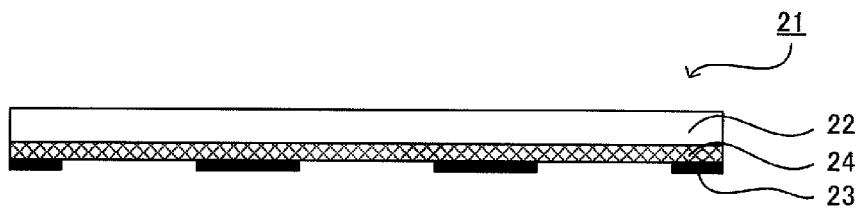
FIG. 4 is a schematic sectional view illustrating another example of the photocatalyst treatment layer substrate for use in the present invention.

As for the position of the light shielding part formed, for example, the light shielding part 23 may be formed in pattern on the base body 22 and a photocatalyst treatment layer 24 formed on the light shielding part 23, as shown in FIG. 2B. Alternatively, a photocatalyst treatment layer 24 may be formed on the base body 22 and a light shielding part 23 formed in pattern on the photocatalyst treatment layer 24, as shown in FIG. 4. Although not shown in the drawing, a light shielding part may be formed in pattern on the surface of the base body opposite to the photocatalyst treatment layer formed.

If a light shielding part is formed on the base body and a light shielding part formed on the photocatalyst treatment layer, because there is a light shielding part formed in the region close to the photocatalyst treatment layer and the wettability variable layer that are provided at a particular distance, it is possible to reduce the influence by energy scattering in the base body or the like, compared to the case of using a photomask. It is thus possible to perform the patterned energy irradiation extremely accurately.

If a light shielding part is formed on the photocatalyst treatment layer, the light shielding part may be used as a spacer for keeping the distance constant, by making the film thickness of the light shielding part identical to the distance of the gap when the photocatalyst treatment layer and the wettability variable layer are provided as separated at a particular distance. Thus, the particular distance can be kept constant, if the light shielding part and the wettability variable layer are provided in tight contact with each other, when the photocatalyst treatment layer and the wettability variable layer are provided, as separated at a particular distance. Energy irradiation in such a state from the side of the photocatalyst treatment layer substrate gives a wettability variable pattern formed accurately on the wettability variable layer surface.

If a light shielding part is formed on the surface of the base body where the photocatalyst treatment layer is not formed, it is possible, for example, to bring the photomask into tight contact with the surface of the light shielding part to the extent that it can be removed, which is advantageous for modification of the process for production of an organic EL element in small lot.

The method of forming the light shielding part is not particularly limited, and is selected properly according to factors such as the desired properties of the light shielding part formed and the desired shielding efficiency to energy.

For example, a metal thin film such as of chromium having a thickness of about 1000 Å to 2000 Å is formed by a method such as sputtering or vacuum deposition, and the light shielding part is formed by patterning the film. The patterning method for use is, for example, a common patterning method.

Alternatively, the light shielding part may be formed, by forming a layer containing light-shielding particles such as carbon fine particles, metal oxide particles or inorganic or organic pigment particles in a resin binder, by patterning. Examples of the resin binder include polyimide resins, acrylic resins, epoxy resins, polyacrylamide, polyvinylalcohol, gelatin, casein, and cellulose. These resins may be used alone or as a mixture of two or more. The resin binder for use may be a photosensitive resin or an O/W emulsion resin composition, for example prepared by emulsification of a reactive silicone. The patterning method for use is a common patterning method such as photolithography or printing.

The thickness of the light shielding part made of a resin binder is preferably set to a value in the range of 0.5 µm to 10 µm.

(iv) Primer Layer

Figure 5:
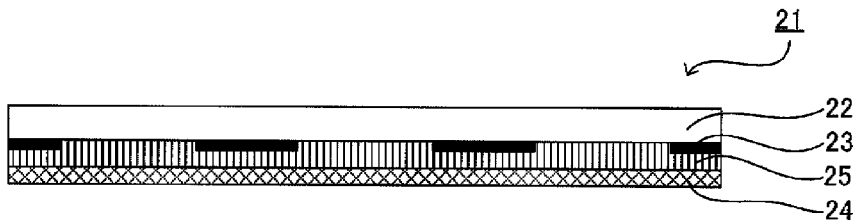
FIG. 5 is a schematic sectional view illustrating yet another example of the photocatalyst treatment layer substrate for use in the present invention.

In the present invention, as described above, if a light shielding part is formed on the base body in pattern and a photocatalyst treatment layer on the light shielding part, for example, a primer layer 25 is preferably formed between the light shielding part 23 and the photocatalyst treatment layer 24, as shown in FIG. 5.

The action and the function of the primer layer is not clearly understood, but the primer layer is considered to have a function to inhibit diffusion of the impurities from the openings present in the light shielding part and between the light shielding parts, in particular, the impurities such as the residues, metals, and metal ions generated when the light shielding part is formed by patterning, which are main factors of inhibiting the change in wettability of the wettability variable layer under the action of the photocatalyst. Thus, presence of the primer layer formed between the light shielding part and photocatalyst treatment layer leads to highly sensitive change in wettability and consequently gives a high-resolution wettability variable pattern.

The primer layer, which is considered to inhibit the adverse effects by the impurities present in the openings of the light shielding part and also between light shielding parts on the action of the photocatalyst, is preferably formed on the entire surface, so that the opening between the patterned light shielding part and between light shielding parts are covered. The primer layer is preferably formed in such a manner that the photocatalyst treatment layer and the light shielding part do not become in physical contact with each other.

The material for the primer layer is not particularly limited, and preferably be an inorganic material resistant to the decomposition under the action of the photocatalyst. The inorganic material is, for example, amorphous silica. The precursor of the amorphous silica is a silicon compound, represented by general formula $SiX_4$, (wherein "X" represents a halogen or a methoxy, ethoxy, acetyl or other group), a hydrolysate silanol thereof, or a polysiloxane thereof having an average molecular weight of 3000 or less.

The thickness of the primer layer is preferably in the range of 0.001 µm to 1 µm, and particularly preferably in the range of 0.001 µm to 0.5 µm.

(2) Positions of Photocatalyst Treatment Layer Substrate and Wettability Variable Layer In the present invention, the photocatalyst treatment layer substrate is provided on the wettability variable layer, as separated by a distance allowing the action of the photocatalyst by energy irradiation. Normally, the photocatalyst treatment layer of the photocatalyst treatment layer substrate and the wettability variable layer are provided at a distance allowing the action of the photocatalyst by energy irradiation on the wettability variable layer.

The distance includes a situation where the photocatalyst treatment layer and the wettability variable layer are in direct contact with each other.

The distance between the photocatalyst treatment layer and the wettability variable layer is preferably, specifically 200 µm or less. Presence of the photocatalyst treatment layer and the wettability variable layer as separated by a particular gap leads to easier desorption of oxygen, water and the active oxygen species generated by photocatalytic action. If the distance between the photocatalyst treatment layer and the wettability variable layer is greater than the range above, the active oxygen species generated by photocatalytic action diffuse to the wettability variable layer less easily, possibly lowering the rate of wettability change. On the other hand, if the distance between the photocatalyst treatment layer and the wettability variable layer is too small, oxygen, water and the active oxygen species generated by photocatalytic action are desorbed less easily, possibly leading to decrease in the rate of wettability change.

For more favorable pattern precision, higher sensitivity of the photocatalyst and improvement of the efficiency of wettability change, the distance is more preferably in the range of 0.2 µm to 20 µm, and still more preferably in the range of 1 µm to 10 µm.

On the other hand, in production of a large-area organic EL element for example of 300 mm×300 mm, it is extremely difficult to form such a thin gap described above between the photocatalyst treatment layer substrate and the wettability variable layer. Thus in production of a relatively large-area organic EL element, the distance is preferably in the range of 5 µm to 100 µm, and more preferably in the range of 10 µm to 75 µm. If the distance is in the range above, it is possible to suppress deterioration in pattern precision, such as pattern blurring, and also deterioration in efficiency of the wettability change due to deterioration in sensitivity of the photocatalyst.

The setting of the distance between the photocatalyst treatment layer substrate and the wettability variable layer for the positioning device of the energy irradiation apparatus during energy irradiation on such a relatively large area is preferably in the range of 10 µm to 200 µm, and particularly preferably in the range of 25 µm to 75 µm. It is because, if the distance setting is in the range above, it is possible to form the photocatalyst treatment layer substrate and the wettability variable layer, without significant deterioration in pattern precision and photocatalyst sensitivity and also without contact thereof with each other.

In the present invention, the positional state at such a distance is preferably preserved at least during energy irradiation.

The photocatalyst treatment layer and the wettability variable layer can be provided as separated evenly by an extremely small distance as described above, for example, by a method of using a spacer. It is possible to form a uniform gap by the spacer method; the action of the photocatalyst does not reach the wettability variable layer surface in the region in contact with the spacer; and thus, it is possible to form a particular wettability variable pattern on the wettability variable layer surface by forming a spacer in a pattern similar to the wettability variable pattern described above.

In the present invention, the spacer may be formed as a single member, but the spacer is preferably formed on the photocatalyst treatment layer of the photocatalyst treatment layer substrate, for simplification of the step. Such a configuration has the advantage described above in the section for the light shielding part.

The spacer preferably has an action to protect the wettability variable layer surface from the action by the photocatalyst. Accordingly, the spacer may not have shielding action to the energy irradiated.

(3) Energy Irradiation

In the present invention, a wettability variable pattern is formed on the wettability variable layer surface, after the photocatalyst treatment layer and the wettability variable layer are provided at a particular distance and are pattern-irradiated with energy from a particular direction.

The wavelength of the light used for energy irradiation is normally set in the range of 450 nm or less, and preferably in the range of 380 nm or less. It is because, as described above, the photocatalyst favorably used as the photocatalyst treatment layer is titanium dioxide and the light at the wavelength above is favorable for activation of the photocatalytic activity of the titanium dioxide.

The light sources for use in energy irradiation include mercury lamp, metal halide lamp, xenon lamp, excimer lamp, and other various light sources.

The energy is irradiated in pattern, for example, by a pattern irradiation method via a photomask by using such a light source or a method of irradiating a laser such as excimer or YAG laser in an image pattern.

The amount of the energy irradiated during energy irradiation is the amount needed for change in wettability of the wettability variable layer surface under the action of the photocatalyst present in the photocatalyst treatment layer.

It is preferable then to irradiate energy while the photocatalyst treatment layer is heated, because it is possible to raise sensitivity and change the wettability more efficiently. Specifically, heating at a temperature in the range of 30° C. to 80° C. is preferable.

The direction of energy irradiation is determined, for example, by whether the light shielding parts are formed on the photocatalyst treatment layer substrate or by the direction of the light desirably emitted from the organic EL element.

For example, if light shielding parts are formed on the photocatalyst treatment layer substrate and the base body of the photocatalyst treatment layer substrate is transparent, the energy irradiation is performed from the photocatalyst treatment layer substrate side. In this case, if a light shielding part is formed on the photocatalyst treatment layer and the light shielding part functions as a spacer, the energy may be irradiated in the direction from the side of the photocatalyst treatment layer substrate or the substrate.

Alternatively, when the photocatalyst treatment layer is formed in pattern, the energy irradiation direction is not limited, as described above, as long as the energy is irradiated to the region where the photocatalyst treatment layer and the wettability variable layer facing each other.

Similarly, even if the spacer described above is used, the energy irradiation direction is not limited, as long as the energy is irradiated to the region where the photocatalyst treatment layer and the wettability variable layer facing each other.

Yet alternatively, if a photomask is used, the energy is irradiated from the photomask-formed side. In this case, the photomask-formed side should be transparent.

After energy irradiation, the photocatalyst treatment layer substrate is separated from the wettability variable layer.

(4) Wettability Variable Pattern

The wettability variable pattern according to the present invention is formed on the wettability variable layer surface and has lyophilic and liquid repellent regions.

The liquid contact angles in the lyophilic and liquid repellent regions are the same as those described in the section of "A. Organic EL element", and the description thereof is omitted.

3. Organic EL Layer-Forming Step

The organic EL layer-forming step according to the present invention is a step of forming an organic EL layer containing at least a light-emitting layer on the lyophilic region.

The organic EL layer-forming step preferably has: a hole injecting/transporting layer-forming step of forming a hole injecting/transporting layer on the lyophilic region, and a light-emitting layer-forming step of forming a light-emitting layer on the hole injecting/transporting layer. In this case, the hole injecting/transporting layer is preferably a hole-injecting layer. It is because, as described above, if the hole-injecting layer is formed by using an acidic material, the hole-injecting layer is not formed directly on the electrode layer and the electrode layer is protected from the hole-injecting layer by the wettability variable layer, and thus, it is possible to reduce the damage of the electrode layer caused under the influence of the acid contained in the hole-injecting layer.

If the organic EL layer-forming step has a hole injecting/transporting layer-forming step and a light-emitting layer-forming step, the hole injecting/transporting layer is first formed only in the lyophilic region by using the wettability variable pattern formed on the wettability variable layer surface. Because the hole injecting/transporting layer surface is lyophilic and the region where no hole injecting/transporting layer is formed is liquid repellent, the light-emitting layer can also be formed only in the lyophilic region because of the difference in wettability.

The method of forming the organic EL layer is not particularly limited, if it is method of forming an organic EL layer in pattern by using the difference in wettability between the lyophilic and liquid repellent regions forming the wettability variable pattern. It is possible, for example, to form an organic EL layer only in the lyophilic region by coating an organic EL layer-coating solution on the wettability variable pattern.

The light-emitting layer-coating solution can be prepared by dispersing or dissolving the light-emitting material described in the section for the light-emitting layer of "A. Organic EL element" in a solvent. If light-emitting layers of three primary colors, red, green and blue, are to be formed, light-emitting layer-coating solutions in various colors, red, green and blue, are used.

The hole injecting/transporting layer-coating solution and the electron injecting/transporting layer-coating solution can be prepared by dispersing or dissolving the respective materials described in the section for the charge injecting/transporting layer of the "A. Organic EL element" in a solvent.

The solvents used in the light-emitting layer-coating solution, the hole injecting/transporting layer-coating solution, and the electron injecting/transporting layer-coating solution are not particularly limited, as long as they can dissolve or disperse respective materials, and examples thereof include chloroform, methylene chloride, dichloroethane, tetrahydrofuran, toluene, and xylene.

The light-emitting layer-coating solution, the hole injecting/transporting layer-coating solution, and the electron injecting/transporting layer-coating solution may contain various additives in addition to the materials and the solvents above. For example, if the light-emitting layer is formed by inkjet method, a surfactant may be added for improvement in ejection efficiency.

Examples of the methods of applying the organic EL layer-coating solution include spin coating, cast coating, dip coating, bar coating, blade coating, roll coating, spray coating, flexographic printing, gravure printing, offset printing, screen printing, and ejection by means of dispenser or inkjet. Among them, if light-emitting layers in three primary colors, red, green and blue, are used, ejection, flexographic printing, or gravure printing is used favorably. The ejection method is particularly preferably, and the inkjet method is more preferable. It is because such a method gives a high-definition pattern by utilizing the wettability variable pattern.

4. Insulation Layer-Forming Step

In the present invention, an insulation layer-forming step of forming an insulation layer on the opening of the pattern of the electrode layer on the substrate having the electrode layer formed in pattern may be carried out in advance to the wettability variable layer-forming step.

The insulation layer is the same as the insulation layer described above in the section of "A. Organic EL element", and the description thereof is omitted.

5. Counter Electrode Layer-Forming Step

In the present invention, normally, a counter electrode layer-forming step of forming a counter electrode layer on the organic EL layer is carried out after the organic EL layer-forming step.

The method of forming the counter electrode layer for use is a common method of forming a film of electrode, and examples thereof include sputtering, ion plating, and vacuum deposition.

For example, if an active organic EL element is to be prepared and a counter electrode layer is to be formed on the entire surface of the substrate, it is preferable to form the counter electrode layer, after the entire surface of the organic EL layer and the wettability variable layer are converted to be lyophilic by lyophilization processing of the liquid repellent region on the surface of the wettability variable layer. A printing method may be used then as the method of forming the counter electrode layer.

The other properties of the counter electrode layer are the same as the second electrode layer described in the section of "A. Organic EL element", and the description thereof is omitted.

6. Other Steps

In the present invention, there may be an additional step of forming a barrier layer for protection of the organic EL layer such as light-emitting layer from the influence by oxygen and steam or a low-refractive index layer for improvement in light emission efficiency on the counter electrode layer.

The present invention is not limited to the embodiments above. The embodiments are examples for explanation, and thus any other embodiments having the substantially same configuration and the same effects as those in the technological idea disclosed in the claims of the present invention are included in the technological scope of the present invention.

EXAMPLES

Hereinafter, the present invention will be explained specifically with reference to Examples and Comparative Examples.

Experimental Example 1

Formation of Wettability Variable Layer

First, a substrate comprising an ITO film, patterned in a stripe shape and has a line width of 2 mm on a glass plate, was prepared as the first electrode layer.

A wettability variable layer-coating solution having the following composition was prepared then. The wettability variable layer-coating solution was coated on the substrate by spin coating and dried under heat at 150° C. for 10 minutes, allowing hardening of the resulting film by hydrolysis and polycondensation reaction, to form a wettability variable layer having a thickness of 10 nm.

| <Composition of wettability variable layer-coating solution> | |
|---|---|
| Organoalkoxysilane (TSL8113 ™, manufactured by GE Toshiba Silicones Co., Ltd.): | 0.4 part by weight |
| Fluoroalkylsilane (TSL8233 ™, manufactured by GE Toshiba Silicones Co., Ltd.): | 0.3 part by weight |
| Isopropyl alcohol: | 480 parts by weight |

(Preparation of Photocatalyst Treatment Layer Substrate)

Subsequently, a photocatalyst treatment layer-coating solution having the following composition was coated on a synthetic quartz substrate by using a spin coater and dried under heat at 150° C. for 10 minutes, allowing hardening of the resulting film by hydrolysis and polycondensation reaction, to form a transparent photocatalyst treatment layer having a thickness of 2000 Å wherein the photocatalyst is fixed tightly to the organosiloxane.

<Composition of photocatalyst treatment layer-coating solution>

| | |
|---|---|
| Titanium dioxide (ST-K01 ™, manufactured by Ishihara Sangyo Kaisha, Ltd.): | 2 parts by weight |
| Organoalkoxysilane (TSL8113 ™, manufactured by GE Toshiba Silicones Co., Ltd.): | 0.4 part by weight |
| Isopropyl alcohol: | 3 parts by weight |

(Formation of Wettability Variable Pattern)

Subsequently, the photocatalyst treatment layer substrate and the wettability variable layer were provided, as separated by the photocatalyst treatment layer at a distance of 20 μm, and a light at 253 nm was irradiated from the rear face of the photocatalyst treatment layer substrate at an exposure intensity of 200 mJ/cm$^2$ in an ultraviolet ray exposure device having a high-pressure mercury lamp as the light source. The light was then irradiated on the entire surface of the wettability variable layer.

The liquid contact angles of the wettability variable layer before and after exposure were determined by using a contact angle meter (manufactured by Kyowa Interface Science Co., Ltd.) The contact angle of the wettability variable layer surface to liquid before exposure was 60°, while that after exposure was less than 10°.

Figure 6A:
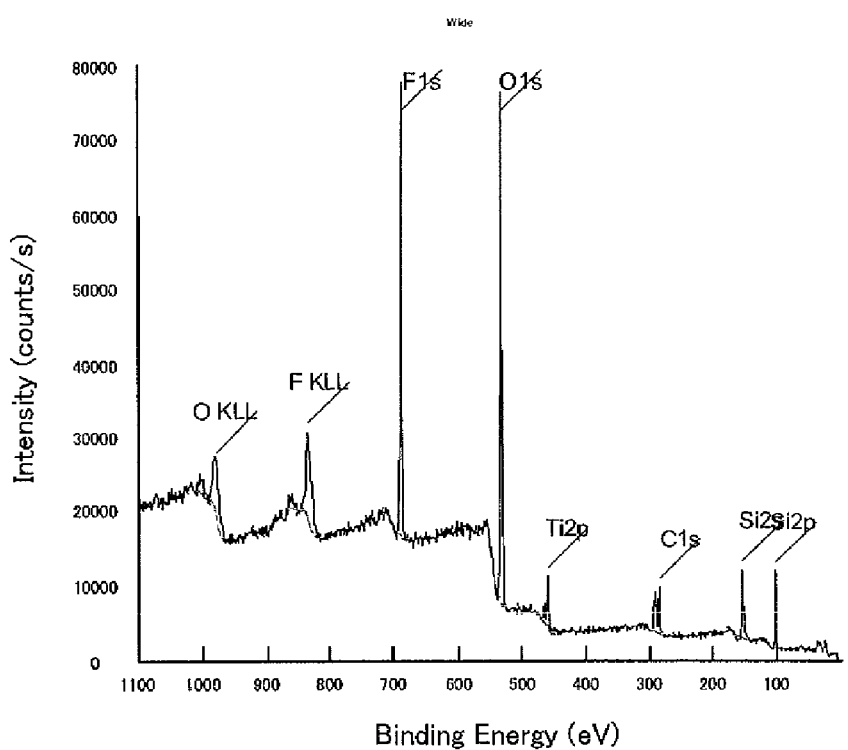
FIGS. 6A and 6B are each an XPS spectrum of the wettability variable layer of the Experimental Example 1 before and after exposure.
Figure 6B:
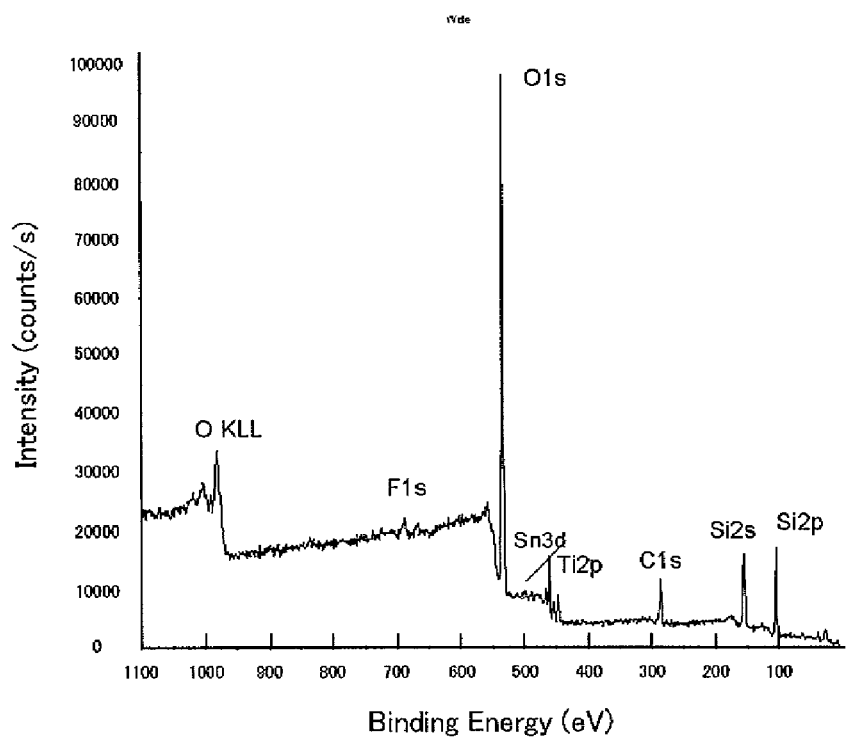

The XPS spectra of the wettability variable layer before and after exposure are shown respectively in FIGS. 6A and 6B. FIG. 6A shows that there is a signal corresponding to $F_{1s}$ observed before exposure, but FIG. 6B shows that the signal corresponding to $F_{1s}$ disappeared after exposure, indicating that the fluorine-containing branched chain of fluoroalkylsilane was decomposed under the action of the photocatalyst caused by UV irradiation. FIGS. 6A and 6B show that there were signals respectively corresponding to $O_{1s}$ and $Si_{2p}$ observed before and after exposure, demonstrating that the main skeleton of the organoalkoxysilane and fluoroalkylsilane, siloxane bonds (—Si—O—), remained undecomposed.

(Formation of Organic EL Layer)

Subsequently, an aqueous dispersion of the salt of poly(3, 4-alkenedioxythiophene) and polystyrenesulfonic acid (PEDOT/PSS) (Baytron P CH-8000™, manufactured by H. C. Stark, Inc.) was coated on the wettability variable layer after exposure by spin coating to a film thickness of 80 nm after drying, and dried in air at 150° C. for 10 minutes, to form a hole-injecting layer. It was found then that the aqueous dispersion of PEDOT/PSS wetted the wettability variable layer and spread favorably thereon.

A light-emitting layer-coating solution having the following composition was prepared. The light-emitting layer-coating solution was coated on the hole-injecting layer by spin coating and dried in nitrogen at 80° C. for 1 hour, to form a light-emitting layer having a thickness of 100 nm.

<Composition of light-emitting layer-coating solution>

| | |
|---|---|
| Light-emitting colorant (ADS132GE ™, manufactured by American Dye Source): | 1 wt part |
| Toluene: | 99 wt parts |

(Formation of Second Electrode Layer)

A Ca film of 10 nm and an Al film of 250 nm were then formed on the substrate having the layers up to the light-emitting layer, to give a light-emitting region of 2 mm×2 mm in size by masked vapor deposition. The Ca and Al films are formed in a stripe pattern perpendicular to the stripe pattern of the ITO film, thus, giving an organic EL element.

The emission when the first electrode layer of the organic EL element obtained was connected to anode and the second electrode layer to cathode and direct current is applied from the a source meter was studied, showing that the emission state was favorable.

Experimental Example 2

An organic EL element was prepared in a manner similar to Experimental Example 1, except that the wettability variable layer was not formed and the irradiation by using the photocatalyst treatment layer substrate was not performed.

The contact angle of the ITO film surface to liquid, as determined by using a contact angle meter (manufactured by Kyowa Interface Science Co., Ltd.), was less than 10°.

The emission when the first electrode layer of the organic EL element obtained was connected to anode and the second electrode layer to cathode and direct current is applied from the a source meter was studied, showing that the emission state was favorable.

[Evaluation of the Organic EL Elements of Experimental Examples 1 and 2]

Figure 7:
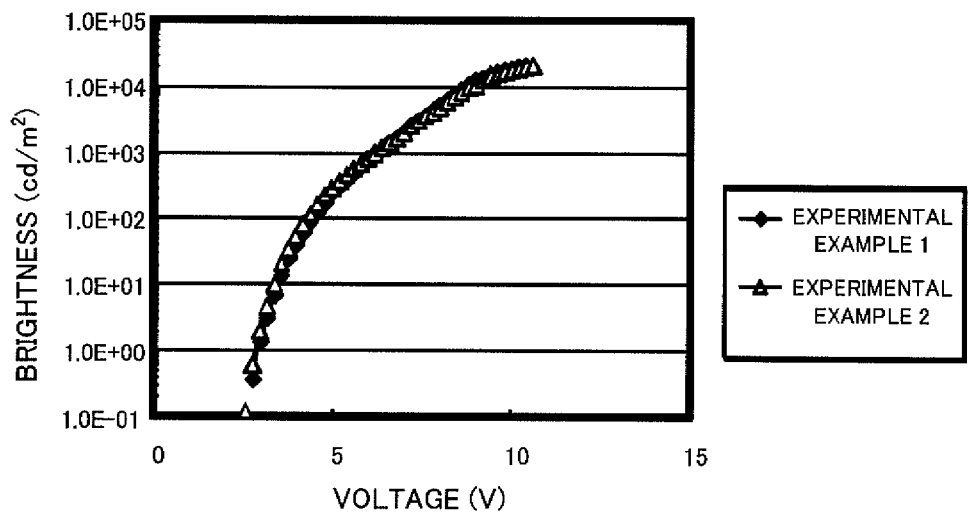
FIG. 7 is a graph showing the brightness-voltage properties of the organic EL elements of Experimental Examples 1 and 2.

The brightness and voltage relationship of the samples of Experimental Examples 1 and 2 is shown in FIG. 7. FIG. 7 shows that the organic EL elements of Experimental Examples 1 and 2 exhibited almost the same brightness-voltage relationship, independently of the presence or absence of the wettability variable layer.

The lifetime of the organic EL elements of Experimental Examples 1 and 2 was also determined. The initial brightness used then was 100 cd/m$^2$ and the lifetime is the period until the brightness thereof becomes half of the initial brightness. As a result, the lifetime of the sample of Experimental Example 1 was found to be 50000 hours, and that of Experimental Example 2 was 30000 hours. It is probably because, in Experimental Example 1, a wettability variable layer was formed on the ITO film and the main chain of the organoalkoxysilane and fluoroalkylsilane constituting the wettability variable layer remained undecomposed even under the action of the photocatalyst caused by UV irradiation, and thus, when the water dispersion of the acidic PEDOT/PSS was coated, the ITO film was protected by the wettability variable layer and the damage of the ITO film caused by PEDOT/PSS was reduced.

Example 1

Formation of Insulation Layer

First, a substrate comprising an ITO film in a stripe pattern having a line width of 80 μm, a space width of 20 μm, and a pitch of 100 μm as the first electrode layer on a glass plate was prepared.

Subsequently, a positive-type photosensitive material (OFPR-800™, manufactured by Tokyo Ohka Kogyo Co., Ltd.) was coated on the entire surface of the substrate to a film thickness of 1.5 μm by spin coating, forming an insulation film, and then, it was irradiated in the pattern of the ITO film by using a photomask designed to have rectangular openings of a width of 70 μm and a length of 70 μm in the light shielding part, and the resulting substrate was developed with an alkaline developing solution (NMD-3, manufactured by Tokyo Ohka Kogyo Co., Ltd.). It was then hardened under heat at 250° C. for 30 minutes, to give an insulation layer.

(Formation of Wettability Variable Layer)

Subsequently, a wettability variable layer-coating solution having the following composition was prepared. The wettability variable layer-coating solution was coated on the substrate by spin coating, dried under heat at 150° C. for 10 minutes, and hardened by hydrolysis and polycondensation reaction, to form a wettability variable layer having a film thickness of 10 nm.

| <Composition of wettability variable layer-coating solution> | |
|---|---|
| Organoalkoxysilane (TSL8113 ™, manufactured by GE Toshiba Silicones Co., Ltd.): | 0.4 part by weight |
| Fluoroalkylsilane (TSL8233 ™, manufactured by GE Toshiba Silicones Co., Ltd.): | 0.3 part by weight |
| Isopropyl alcohol: | 480 parts by weight |

(Preparation of Photocatalyst Treatment Layer Substrate)

Subsequently, a photomask designed to have rectangular openings of a width of 85 μm and a length of 85 μm in the light shielding part was prepared according to the pattern of the ITO film. A photocatalyst treatment layer-coating solution having the following composition was coated on the photomask by using a spin coater, dried under heat at 150° C. for 10 minutes, and hardened in hydrolysis and polycondensation reaction, to form a transparent photocatalyst treatment layer having a film thickness of 2000 Å that contains a photocatalyst tightly fixed in the organosiloxane.

| <Composition of photocatalyst treatment layer-coating solution> | |
|---|---|
| Titanium dioxide (ST-K01 ™, manufactured by Ishihara Sangyo Kaisha, Ltd.): | 2 parts by weight |
| Organoalkoxysilane (TSL8113 ™, manufactured by GE Toshiba Silicones Co., Ltd.): | 0.4 part by weight |
| Isopropyl alcohol: | 3 parts by weight |

(Formation of Wettability Variable Pattern)

Subsequently, in an ultraviolet irradiation device having a high-pressure mercury lamp as the light source and a mechanism of adjusting the distance between the photocatalyst treatment layer substrate and the substrate, the relative position of the photocatalyst treatment layer substrate and the substrate was adjusted so that the opening in the light shielding part of the photocatalyst treatment layer substrate and the pattern of the ITO film of the substrate faced each other, and the distance between the photocatalyst treatment layer and the wettability variable layer was adjusted to 20 μm, and then, a light at a wavelength of 253 nm was irradiated from the rear face side of the photocatalyst treatment layer substrate at an irradiation intensity of 200 mJ/cm².

The liquid contact angles of the wettability variable layer in the exposed and unexposed regions were determined by using a contact angle meter (manufactured by Kyowa Interface Science Co., Ltd.). Results are summarized in the following Table 1.

(Formation of Organic EL Layer)

Then, an aqueous dispersion of the salt of poly(3,4-alkenedioxythiophene) and polystyrenesulfonic acid (PEDOT/PSS) (Baytron P CH-8000™, manufactured by H. C. Stark, Inc.) was diluted with isopropyl alcohol, to give a hole-injecting layer-coating solution. The viscosity and the surface tension of the hole-injecting layer-coating solution were found to be respectively 7 mPa·S and 37 dyn/cm. The hole-injecting layer-coating solution was coated on the lipophilic region, i.e., the exposed region of the wettability variable layer, by inkjet method to a dry film thickness of 80 nm and dried in air at 150° C. for 10 minutes, to form a hole-injecting layer. Subsequent SEM observation of the cross section showed that the hole-injecting layer-coating solution wetted and spread favorably in the desired region.

Subsequently, light-emitting layer-coating solutions in various colors having the following compositions were prepared. The viscosity and the surface tension of the various colors light-emitting layer-coating solution were found respectively to be 12 mPa·S and 35 dyn/cm. Each of the light-emitting layer-coating solutions in various colors was coated on a particular region on the hole-injecting layer by inkjet method and dried in nitrogen at 130° C. for 1 hour, forming each of the light-emitting layers in various colors. The light-emitting layers in various colors were then observed under fluorescence microscope.

| <Red light-emitting layer-coating solution> | |
|---|---|
| Polyvinyl carbazole: | 7 wt parts |
| Red light-emitting colorant: | 0.1 wt parts |
| Oxadiazole compound: | 3 wt parts |
| Tetralin: | 990 wt parts |
| <Green light-emitting layer-coating solution> | |
| Polyvinyl carbazole: | 7 wt parts |
| Green light-emitting colorant: | 0.1 wt part |
| Oxadiazole compound: | 3 wt parts |
| Tetralin: | 990 wt parts |
| <Blue light-emitting layer-coating solution> | |
| Polyvinyl carbazole: | 7 wt parts |
| Blue light-emitting colorant: | 0.1 wt part |
| Oxadiazole compound: | 3 wt parts |
| Tetralin: | 990 wt parts |

(Formation of Second Electrode Layer)

A Ca film of 1000 Å and an Al film of 2000 Å were then formed on the light-emitting layers by using a vacuum evaporator, to give an organic EL element.

The emission state was observed, while the first electrode layer of the organic EL element obtained was connected to anode and the second electrode layer to cathode and direct current was applied from a source meter. Results are summarized in the following Table 1.

Example 2

An organic EL element was prepared in a manner similar to Example 1, except that the photocatalyst treatment layer substrate was prepared and the wettability variable pattern was formed in the following manner.

(Preparation of Photocatalyst Treatment Layer Substrate)

A positive-type photosensitive material (OFPR-800™, manufactured by Tokyo Ohka Kogyo Co., Ltd.) was coated on the entire surface of a synthetic quartz substrate by spin coating, forming a photosensitive material layer having a thickness of 1.5 μm; then, light was irradiated by using a photomask designed to have rectangular openings of a width of 85 μm and a length of 85 μm in the light shielding part according to the pattern of the ITO film; and the resulting substrate was developed with an alkaline developing solution (NMD-3, manufactured by Tokyo Ohka Kogyo Co., Ltd.). Then, a titanium oxide film was formed on the synthetic quartz substrate having the patterned photosensitive material layer by sputtering. A titanium oxide film was then formed in the opening of the pattern of the photosensitive material layer. Ultraviolet ray was irradiated then on the entire surface of the substrate, and the photosensitive material layer was removed by using an alkaline developing solution (NMD-3™, manufactured by Tokyo Ohka Kogyo Co., Ltd.), to give a patterned transparent photocatalyst treatment layer having a thickness of 2000 Å.

| <Composition of photocatalyst treatment layer-coating solution> | |
| --- | --- |
| Titanium dioxide (ST-K01 ™, manufactured by Ishihara Sangyo Kaisha, Ltd.): | 2 parts by weight |
| Organoalkoxysilane (TSL8113 ™, manufactured by GE Toshiba Silicones Co., Ltd.): | 0.4 part by weight |
| Isopropyl alcohol: | 3 parts by weight |

(Formation of Wettability Variable Pattern)

Subsequently, in an ultraviolet irradiation device having a high-pressure mercury lamp as the light source and a mechanism of adjusting the distance between the photocatalyst treatment layer substrate and the substrate, the relative position of the photocatalyst treatment layer substrate and the substrate was adjusted so that the opening in the light shielding part of the photocatalyst treatment layer substrate and the pattern of the ITO film of the substrate faced each other, and the distance between the photocatalyst treatment layer and the wettability variable layer was adjusted to 20 μm, and then, a light at a wavelength of 253 nm was irradiated from the rear face side of the photocatalyst treatment layer substrate at an irradiation intensity of 4000 mJ/cm$^2$.

The liquid contact angles of the wettability variable layer in the region facing to the photocatalyst treatment layer and the region not facing thereto were determined by using a contact angle meter (manufactured by Kyowa Interface Science Co., Ltd.) Results are summarized in the following Table 1.

The emission state was observed, while the first electrode layer of the organic EL element obtained was connected to anode and the second electrode layer to cathode and direct current was applied from a source meter. Results are summarized in the following Table 1.

Comparative Example 1

An organic EL element was prepared in a manner similar to Example 1, except that the photocatalyst treatment layer substrate used in Example 1 was replaced with a photomask designed to have rectangular openings of a width of 85 μm and a length of 85 μm in the light shielding part.

Comparative Example 2

An organic EL element was prepared in a manner similar to Example 2, except that the photocatalyst treatment layer substrate used in Example 2 was replaced with a photomask designed to have rectangular openings of a width of 85 μm and a length of 85 μm in the light shielding part.

[Evaluation of the Organic EL Elements of Examples 1 and 2 and Comparative Examples 1 and 2]

Observation results of the wettability, the appearance of the light-emitting layer and the emission state of the organic EL elements of Examples 1 and 2 and Comparative Examples 1 and 2 and are summarized in Table 1.

TABLE 1

| | Contact angle of the exposed region or the region facing the photocatalyst treatment layer (°) | Contact angle of the unexposed region or the region not facing the photocatalyst treatment layer (°) | Patterning of light-emitting layer | Emission state |
| --- | --- | --- | --- | --- |
| Example 1 | <10 | 60 | Favorable | Favorable |
| Example 2 | <10 | 60 | Favorable | Favorable |
| Comparative Example 1 | 60 | 60 | Unfavorable | No emission |
| Comparative Example 2 | 60 | 60 | Unfavorable | No emission |

Example 3

An organic EL element was prepared in a manner similar to Example 1, except that the wettability variable layer was formed in the following manner.

(Formation of Wettability Variable Layer)

A wettability variable layer-coating solution having the following composition was prepared. The wettability variable layer-coating solution was coated on a substrate by spin coating, dried under heat at 150° C. for 10 minutes, and hardened in hydrolysis and polycondensation reaction, to form a wettability variable layer having a thickness of 80 nm.

| <Composition of wettability variable layer-coating solution> | |
| --- | --- |
| Organoalkoxysilane (TSL8113 ™, manufactured by GE Toshiba Silicones Co., Ltd.): | 0.4 part by weight |
| Fluoroalkylsilane (TSL8233 ™, manufactured by GE Toshiba Silicones Co., Ltd.): | 0.3 part by weight |
| Isopropyl alcohol: | 60 parts by weight |

Example 4

An organic EL element was prepared in a manner similar to Example 1, except that the wettability variable layer was formed in the following manner.

(Formation of Wettability Variable Layer)

A wettability variable layer-coating solution having the following composition was prepared. The wettability variable layer-coating solution was coated on a substrate by spin coating, dried under heat at 150° C. for 10 minutes, and hardened in hydrolysis and polycondensation reaction, to form a wettability variable layer having a thickness of 40 nm.

| <Composition of wettability variable layer-coating solution> | |
| --- | --- |
| Organoalkoxysilane (TSL8113 ™, manufactured by GE Toshiba Silicones Co., Ltd.): | 0.4 part by weight |
| Fluoroalkylsilane (TSL8233 ™, manufactured by GE Toshiba Silicones Co., Ltd.): | 0.3 part by weight |
| Isopropyl alcohol: | 120 parts by weight |

[Evaluation of the Organic EL Elements of Examples 1, 3 and 4]

Figure 8:
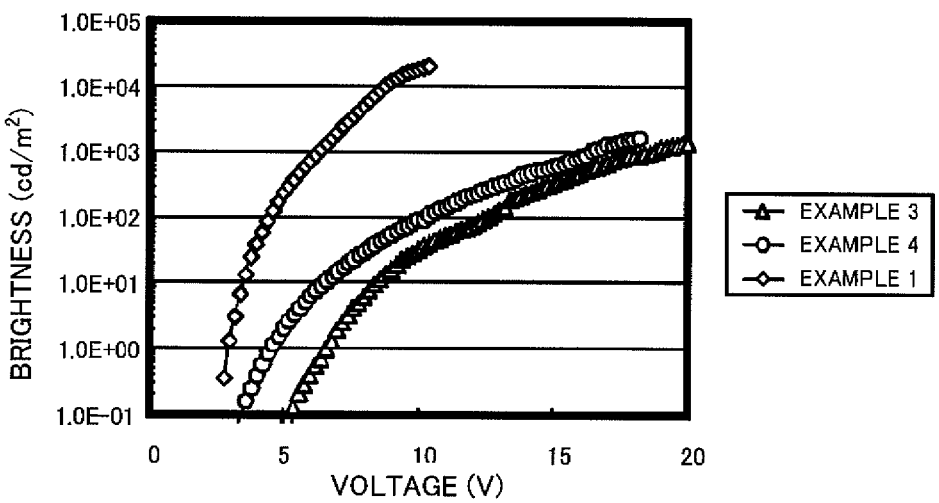
FIG. 8 is a graph showing the brightness-voltage properties of the organic EL elements of Examples 1, 3 and 4.

The brightness and voltage characteristics of the samples of Examples 1, 3 and 4 are summarized in FIG. 8. The curve shifted downward to the lower voltage when the thickness of the wettability variable layer is thinner, indicating that the emission initiation voltage is lowered. The film thickness of the wettability variable layer in the sample of Example 1 is relatively low at 10 nm, and thus, the emission initiation voltage was lower than those of Examples 3 and 4 and the maximum brightness was raised.

The invention claimed is:

1. An organic electroluminescence element, comprising:
   a substrate;
   a first electrode layer formed in pattern on the substrate;
   a wettability variable layer formed on the first electrode layer, wherein the layer changes its wettability under an action of a photocatalyst caused by energy irradiation, is inactive to the energy, and has, on a surface thereof, a wettability variable pattern comprising a lyophilic region formed on the pattern of the first electrode layer and containing organopolysiloxane and a liquid repellent region formed on an opening of the pattern of the first electrode layer and containing a fluorine-containing organopolysiloxane;
   an organic electroluminescence layer formed directly on the lyophilic region of the wettability variable layer and containing at least a light-emitting layer; and
   a second electrode layer formed on the organic electroluminescence layer,
   wherein the wettability variable layer comprises substantially no photocatalyst.

2. The organic electroluminescence element according to claim 1, wherein the organic electroluminescence layer comprises a hole injecting/transporting layer and the hole injecting/transporting layer is formed between the wettability variable layer and the light-emitting layer.

3. The organic electroluminescence element according to claim 2, wherein a thickness of the wettability variable layer is 20 nm or less.

4. The organic electroluminescence element according to claim 2, wherein an insulation layer is formed on the opening of the pattern of the first electrode layer formed on the substrate.

5. The organic electroluminescence element according to claim 1, wherein a thickness of the wettability variable layer is 20 nm or less.

6. The organic electroluminescence element according to claim 1, wherein an insulation layer is formed on the opening of the pattern of the first electrode layer formed on the substrate.

7. A method of producing an organic electroluminescence element, comprising:
   a wettability variable layer-forming step of forming a wettability variable layer, which changes its wettability under an action of a photocatalyst caused by energy irradiation and comprises substantially no photocatalyst, on a substrate having an electrode layer formed;
   a wettability variable pattern-forming step of forming a wettability variable pattern of a lyophilic region and a liquid repellent region on the wettability variable layer surface,
   wherein the pattern is formed by providing a photocatalyst treatment layer substrate, which has a photocatalyst treatment layer containing at least a photocatalyst formed on a base body, at a distance from the wettability variable layer allowing the action of the photocatalyst caused by energy irradiation to the photocatalyst treatment layer substrate to reach the wettability variable layer and by irradiating the photocatalyst treatment layer substrate with energy to cause the action of the photocatalyst; and
   an organic electroluminescence layer-forming step of forming an organic electroluminescence layer containing at least a light-emitting layer directly on the lyophilic region.

8. The method of producing an organic electroluminescence element according to claim 7, wherein the organic electroluminescence layer-forming step includes a hole injecting/transporting layer-forming step of forming a hole injecting/transporting layer on the lyophilic region and a light-emitting layer-forming step of forming a light-emitting layer on the hole injecting/transporting layer.

9. The method of producing an organic electroluminescence element according to claim 8, wherein the photocatalyst treatment layer of the photocatalyst treatment layer substrate is formed in pattern on the base body.

10. The method of producing an organic electroluminescence element according to claim 8, wherein a light shielding part of the photocatalyst treatment layer substrate is formed in pattern on the base body.

11. The method of producing an organic electroluminescence element according to claim 8, wherein the wettability variable layer contains an organopolysiloxane of a hydrolytic condensate or a co-hydrolytic condensate of one or more silicon compounds represented by the following formula:
   $Y_n SiX_{(4-n)}$ (in which, "Y" represents an alkyl group, a fluoroalkyl group, a vinyl group, an amino group, a phenyl group or an epoxy group; "X" represents an alkoxyl group or an acetyl group or a halogen; and "n" is an integer of 0 to 3).

12. The method of producing an organic electroluminescence element according to claim 8, wherein an insulation layer-forming step of forming an insulation layer, reflecting or absorbing the energy irradiated in the wettability variable pattern-forming step, on an opening of a pattern of the electrode layer formed on the substrate having the electrode layer formed in pattern is carried out in advance to the wettability variable layer-forming step.

13. The method of producing an organic electroluminescence element according to claim 7, wherein the photocatalyst treatment layer of the photocatalyst treatment layer substrate is formed in pattern on the base body.

14. The method of producing an organic electroluminescence element according to claim 7, wherein a light shielding part of the photocatalyst treatment layer substrate is formed in pattern on the base body.

15. The method of producing an organic electroluminescence element according to claim 7, wherein the wettability variable layer contains an organopolysiloxane of a hydrolytic condensate or a co-hydrolytic condensate of one or more silicon compounds represented by the following formula:
   $Y_n SiX_{(4-n)}$ (in which, "Y" represents an alkyl group, a fluoroalkyl group, a vinyl group, an amino group, a phenyl group or an epoxy group; "X" represents an alkoxyl group or an acetyl group or a halogen; and "n" is an integer of 0 to 3).

16. The method of producing an organic electroluminescence element according to claim 7, wherein an insulation layer-forming step of forming an insulation layer, reflecting or absorbing the energy irradiated in the wettability variable pattern-forming step, on an opening of a pattern of the electrode layer formed on the substrate having the electrode layer formed in pattern is carried out in advance to the wettability variable layer-forming step.

* * * * *